United States Patent
Yoshida et al.

(10) Patent No.: US 9,312,659 B2
(45) Date of Patent: Apr. 12, 2016

(54) NITRIDE SEMICONDUCTOR LASER ELEMENT

(71) Applicant: Panasonic Intellectual Property Management Co., Ltd., Osaka (JP)

(72) Inventors: Shinji Yoshida, Shiga (JP); Atsunori Mochida, Osaka (JP); Takahiro Okaguchi, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/556,195

(22) Filed: Nov. 30, 2014

(65) Prior Publication Data
US 2015/0124847 A1 May 7, 2015

Related U.S. Application Data

(63) Continuation of application No. PCT/JP2013/005075, filed on Aug. 28, 2013.

(30) Foreign Application Priority Data

Dec. 19, 2012 (JP) ................ 2012-276491

(51) Int. Cl.
*H01S 5/00* (2006.01)
*H01S 5/028* (2006.01)
(Continued)

(52) U.S. Cl.
CPC ............ *H01S 5/0282* (2013.01); *B82Y 20/00* (2013.01); *H01S 5/028* (2013.01); *H01S 5/0281* (2013.01);
(Continued)

(58) Field of Classification Search
CPC ..... H01S 5/0281; H01S 5/0282; H01S 5/028; H01S 5/3013; H01S 5/323; H01S 5/343; H01S 5/06825

USPC ............................. 372/49.01, 43.01
See application file for complete search history.

(56) References Cited

U.S. PATENT DOCUMENTS 7,869,482 B2 1/2011 Kubota et al.
2007/0080368 A1* 4/2007 Kamikawa et al. ........... 257/103
(Continued)

FOREIGN PATENT DOCUMENTS

CN 1983748 6/2007
CN 102714393 10/2012
(Continued)

OTHER PUBLICATIONS

International Search Report of PCT application No. PCT/JP2013/005075 dated Sep. 24, 2013.
(Continued)

*Primary Examiner* — Kinam Park
(74) *Attorney, Agent, or Firm* — Panasonic Patent Center

(57) ABSTRACT

Provided is a highly reliable nitride semiconductor laser element having a robust end face protection film not being peeled even in laser operation. The nitride semiconductor laser element includes: a semiconductor multi-layer structure including a group III nitride semiconductor and having a light-emitting end face; and a protection film including a dielectric multi-layer film and covering the light-emitting end face of the semiconductor multi-layer structure. The protection film includes an end face protection layer and an oxygen diffusion suppression layer arranged sequentially in stated order from the light-emitting end face. The end face protection layer includes a crystalline film comprising nitride including aluminum. The oxygen diffusion suppression layer has a structure in which a metal oxide film is between silicon oxide films. The metal oxide film is crystallized by laser light.

14 Claims, 13 Drawing Sheets

(51) Int. Cl.
  *H01S 5/30* (2006.01)
  *H01S 5/323* (2006.01)
  *H01S 5/343* (2006.01)
  *H01S 5/068* (2006.01)
  *B82Y 20/00* (2011.01)

(52) U.S. Cl.
  CPC ........... *H01S 5/06825* (2013.01); *H01S 5/3013* (2013.01); *H01S 5/323* (2013.01); *H01S 5/343* (2013.01); *H01S 5/34333* (2013.01)

(56) References Cited

U.S. PATENT DOCUMENTS

| | | |
|---|---|---|
| 2007/0138492 A1 | 6/2007 | Kamikawa et al. |
| 2007/0205424 A1* | 9/2007 | Kamikawa et al. ............ 257/94 |
| 2007/0246720 A1* | 10/2007 | Kamikawa et al. ............ 257/94 |
| 2008/0144687 A1 | 6/2008 | Kawaguchi et al. |
| 2008/0181274 A1* | 7/2008 | Michiue et al. .......... 372/44.011 |
| 2008/0291961 A1 | 11/2008 | Kamikawa et al. |
| 2009/0026481 A1 | 1/2009 | Kamikawa et al. |
| 2009/0075413 A1 | 3/2009 | Kamikawa et al. |
| 2009/0159923 A1 | 6/2009 | Kamikawa et al. |
| 2009/0218593 A1 | 9/2009 | Kamikawa et al. |
| 2009/0236630 A1* | 9/2009 | Mochida et al. .............. 257/103 |
| 2009/0252191 A1* | 10/2009 | Kubota et al. .............. 372/50.11 |
| 2010/0014550 A1* | 1/2010 | Hasegawa et al. ......... 372/49.01 |
| 2010/0133582 A1* | 6/2010 | Mochida et al. .............. 257/103 |
| 2010/0316082 A1* | 12/2010 | Kawaguchi et al. ....... 372/49.01 |
| 2012/0015465 A1 | 1/2012 | Kamikawa et al. |
| 2012/0057612 A1* | 3/2012 | Yoshida et al. ............. 372/49.01 |
| 2013/0022070 A1 | 1/2013 | Tange et al. |

FOREIGN PATENT DOCUMENTS

| | | |
|---|---|---|
| JP | 2007-273951 | 10/2007 |
| JP | 2007-318088 | 12/2007 |
| JP | 2008-182208 | 8/2008 |
| JP | 2009-231470 | 10/2009 |
| JP | 2009-252861 | 10/2009 |
| JP | 2010-135516 | 6/2010 |
| JP | 2010-287717 | 12/2010 |
| JP | 2011-009374 | 1/2011 |
| JP | 2012-044230 | 3/2012 |

OTHER PUBLICATIONS

English Translation of Chinese Search Report dated May 5, 2015 for the related Chinese Patent Application No. 201380031459.1.
English Translation of Chinese Search Report dated Sep. 25, 2015 for the related Chinese Patent Application No. 201380031459.1.

* cited by examiner

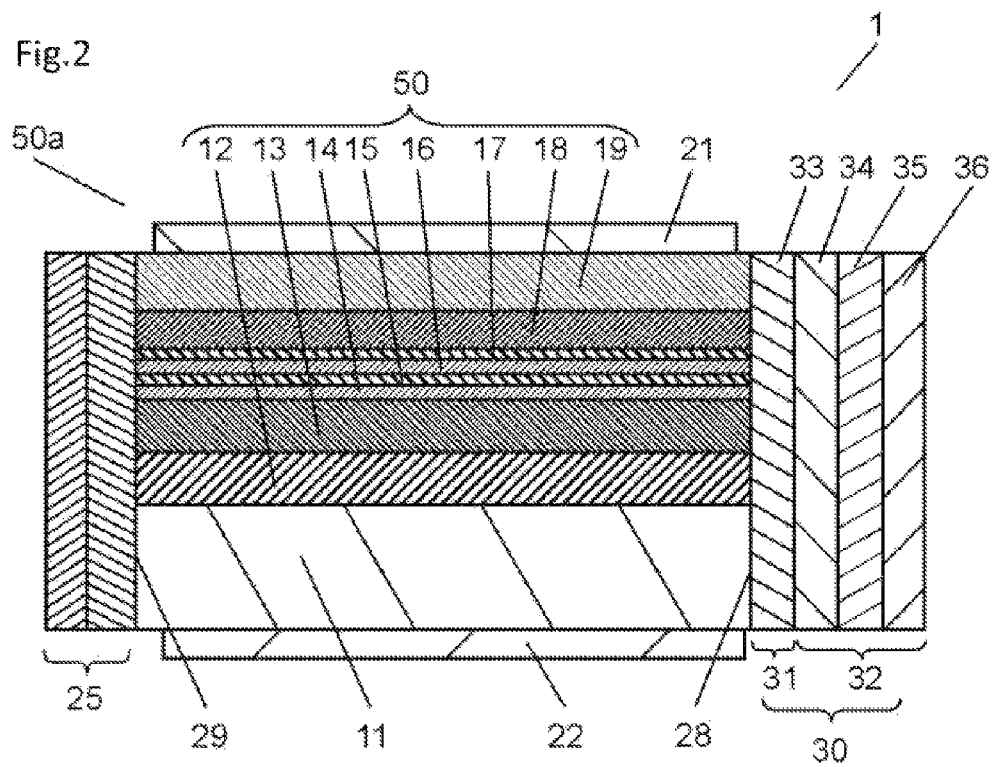
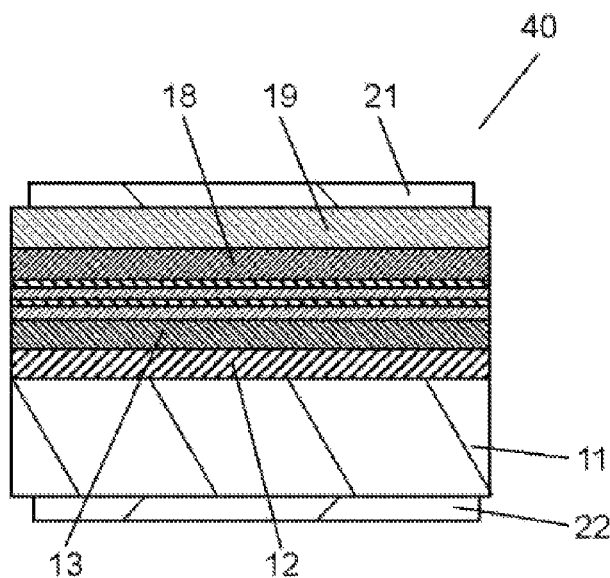

NITRIDE SEMICONDUCTOR LASER ELEMENT

TECHNICAL FIELD

The present invention relates to nitride semiconductor laser elements, and more particularly to a nitride semiconductor laser element having a light-emitting end face with a protection film.

BACKGROUND ART

Among semiconductor laser elements, nitride semiconductor laser elements have been used as light sources for reproducing and recording operations of optical disc mediums represented by Blu-ray discs and the like. It has also been examined to adjust wavelengths of emission light to use nitride semiconductor laser elements as light sources for processing such as laser annealing or light sources for displays of projectors, laser television sets, and the like. Furthermore, nitride semiconductor laser elements have been examined to be combined with phosphors or the like to be solid-state light sources for displays, lighting devices, and the like.

For general semiconductor lasers including nitride semiconductor laser elements, it has been known that some phenomena prevent oscillation of the semiconductor lasers. For example, increase of a light output gradually increases an operation current under certain light-output conditions. This is a deterioration phenomenon which prevents laser oscillation. The increase of light output further causes a phenomenon called optical breakdown which also prevents oscillation of semiconductor lasers. In order to gain a high light output from nitride semiconductor laser elements, various techniques have been developed to suppress or prevent such deterioration of nitride semiconductor laser elements.

Examples of such conventional techniques are disclosed in PTLs (Patent Literatures) 1 and 2. These patent literatures disclose structures capable of suppressing a sudden death that causes optical breakdown. It is thereby possible to increase a light output up to several hundreds of mW without the deterioration.

More specifically, according to the patent literatures, conventional semiconductor laser elements have a pair of facing end faces (a light-emitting end face is referred to as a front end face, and the other end face is referred to as a rear end face) which are covered with protection films. The protection film covering the light-emitting end face, from which laser light is outputted, is manufactured robust and stable to suppress optical breakdown.

Conventional nitride semiconductor laser element 400 will be described with reference to FIG. 18. Conventional nitride semiconductor laser element 400 has nitride semiconductor layer 410 including an active layer (light-emitting layer) on an n-type GaN substrate. Nitride semiconductor layer 410 has front end face 413 and rear end face 414. On front end face 413, there is provided an end face coat film that includes first end face coat film 415 and second end face coat film 416. On rear end face 414, there is provided end face coat film 417. It is disclosed that first end face coat film 415 is an aluminum nitride (AlN) film, and that second end face coat film 416 is an aluminum oxide ($Al_2O_3$) film.

In the above-described conventional structure, the AlN film serving as the first end face coat film is a hexagonal crystalline film. In comparison to general AlN films, a hexagonal crystalline film further prevents oxidation and peeling of the end face of the nitride semiconductor laser element. Optical breakdown and end face deterioration are thereby suppressed. As a result, a light output is increased up to several hundreds of mW.

CITATION LIST

Patent Literatures

PTL 1: Unexamined Japanese Patent Application Publication No. 2007-318088
PTL 2: Unexamined Japanese Patent Application Publication No. 2012-044230

SUMMARY OF THE INVENTION

However, if a light output is to be higher, in particular, over 1 W (watt), merely using AlN crystalline films as coat films as disclosed in the conventional structure is not enough to suppress characteristic deterioration of nitride semiconductor laser elements.

In order to solve the problem of the conventional techniques, an object of the present invention is to provide a nitride semiconductor laser element capable of suppressing deterioration of a light-emitting end face and/or a coat film even in high light-output operation, thereby being operable over a long time.

In accordance with an aspect of the present invention for achieving the object, there is provided a nitride semiconductor laser element including: a semiconductor multi-layer structure including a group III nitride semiconductor and having a light-emitting end face; and a protection film including a dielectric multi-layer film and covering the light-emitting end face of the semiconductor multi-layer structure, wherein the protection film includes an end face protection layer and an oxygen diffusion suppression layer arranged sequentially in stated order from the light-emitting end face, the end face protection layer includes an aluminum nitride film, the oxygen diffusion suppression layer includes at least one metal oxide film, and the metal oxide film is crystallized by laser light outputted from the light-emitting end face.

With the above structure, the metal oxide film is crystallized by the laser light outputted from the light-emitting end face. The crystallization increases a density of the metal oxide film to block oxygen diffusion. The blockage suppresses deterioration inside the protection film. As a result, it is possible to provide the nitride semiconductor laser element with high output and a long life.

It is desirable that the oxygen diffusion suppression layer includes at least one silicon oxide film and the at least one metal oxide film arranged sequentially in stated order from the end face protection layer.

With the desirable structure, the silicon oxide film is provided between the aluminum nitride film and the metal oxide film. The provision of the silicon oxide film relaxes increase of a film stress caused by oxidation reaction progress. The relaxation suppresses peeling of the films in the protection film. As a result, it is possible to provide the nitride semiconductor laser element with high output and a long life.

It is further desirable that the oxygen diffusion suppression layer includes the at least one metal oxide film and at least two silicon oxide films, the at least one metal oxide film being between the at least two silicon oxide films.

It is still further desirable that the metal oxide film is an oxide film including one of aluminum, zirconium, hafnium, titanium, tantalum, and zinc.

With the desirable structure, absorption of light having a wavelength of around 400 nm facilitates crystallization reaction. The resulting crystallized metal oxide film blocks oxygen transmission to prevent oxygen from entering the protection film. As a result, it is possible to provide the nitride semiconductor laser element with high output and a long life.

It is further desirable that the end face protection layer includes: a first aluminum nitride film directly covering the light-emitting end face; a first metal oxide film covering the first aluminum nitride film; and a second aluminum nitride film covering the first metal oxide film With the desirable structure, the two aluminum nitride films protect the end face to block oxygen diffusion to the light-emitting end face. As a result, it is possible to provide the nitride semiconductor laser element with high output and a long life.

It is still further desirable that the first metal oxide film is an aluminum oxide film With the desirable structure, the metal oxide film is positioned between the aluminum nitride films. Therefore, the metal oxide film is crystallized with less oxygen diffusion to be a crystalline aluminum oxide film having a high film density. The resulting crystalline aluminum oxide film suppresses oxygen diffusion to the light-emitting end face. As a result, it is possible to provide the nitride semiconductor laser element with high output and a long life.

It is still further desirable that the first aluminum nitride film mainly has m-axis orientation with respect to the light-emitting end face, and the second aluminum nitride film mainly has c-axis orientation.

With the desirable structure, the metal oxide film is positioned between the aluminum nitride films. The m-axis orientated aluminum nitride film has substrate effects to make the metal oxide film a crystalline film having a high density. The c-axis oriented aluminum nitride film (second aluminum nitride film) relaxes a stress in the metal oxide film. Therefore, oxygen transmission is blocked, and film peeling caused by crystallization is prevented. As a result, it is possible to provide the nitride semiconductor laser element with high output and a long life.

It is still further desirable that the light-emitting end face of the nitride semiconductor laser element has one of a maximum reflectance and a minimum reflectance in a reflectance spectrum with respect to a wavelength of laser outputted from the light-emitting end face.

The desirable structure can reduce variations of a reflectance even if the metal oxide film has a refractive index varying depending on optical crystallization. As a result, it is possible to provide the nitride semiconductor laser element capable of keeping stable characteristics even in performing high-output operation for a long time.

It is still further desirable that a region crystallized by the laser light in the metal oxide film corresponds to a region of a near-field image of the laser light.

It is still further desirable that the metal oxide film is one of zirconium oxide and titanium oxide.

With the desirable structure, as zirconium oxide and titanium oxide are speedily optical-crystallized, the use of zirconium oxide or titanium oxide results in speedy forming of a crystalline film having a high film density. Therefore, oxygen diffusion to the light-emitting end face is speedily suppressed. As a result, it is possible to provide the nitride semiconductor laser element with high output and a long life.

In accordance with another aspect of the present invention, there is provided a nitride semiconductor laser element including: a semiconductor multi-layer structure including a group III nitride semiconductor and having a light-emitting end face; and a protection film including a dielectric multi-layer film and covering the light-emitting end face of the semiconductor multi-layer structure, wherein the protection film includes an end face protection layer and an oxygen diffusion suppression layer arranged sequentially in stated order from the light-emitting end face, the end face protection layer includes a crystalline aluminum oxynitride film, the oxygen diffusion suppression layer includes at least one metal oxide film, and the metal oxide film is crystallized by laser light outputted from the light-emitting end face.

With the above structure, the metal oxide film is crystallized by the laser light outputted from the light-emitting end face. The crystallization increases a density of the metal oxide film to block oxygen diffusion. The blockage suppresses deterioration inside the protection film. As a result, it is possible to provide the nitride semiconductor laser element with high output and a long life.

It is desirable that the end face protection layer includes: a first aluminum oxynitride film directly covering the light-emitting end face; a first metal oxide film covering the first aluminum oxynitride film; and a second aluminum oxynitride film covering the first metal oxide film.

With the desirable structure, the two aluminum oxynitride films protect the end face to block oxygen diffusion to the light-emitting end face. As a result, it is possible to provide the nitride semiconductor laser element with high output and a long life.

It is still further desirable that the first aluminum oxynitride film mainly has m-axis orientation with respect to the light-emitting end face, and the second aluminum oxynitride film mainly has c-axis orientation.

With the desirable structure, the metal oxide film is positioned between the aluminum oxynitride films. The m-axis orientated aluminum oxynitride film has substrate effects to make the metal oxide film a crystalline film having a high density. The c-axis oriented aluminum oxynitride film (second aluminum oxynitride film) relaxes a stress caused in the metal oxide film. Therefore, oxygen transmission is blocked, and film peeling caused by crystallization is prevented. As a result, it is possible to provide the nitride semiconductor laser element with high output and a long life.

It is still further desirable that composition of nitrogen atoms in the aluminum oxynitride film is 40% or more.

According to the nitride semiconductor laser element of the present invention, even in high-output operation, oxidation reaction does not occur in the protection film. The end face protection film is thereby robust enough to prevent optical breakdown even in high-output operation. As a result, the nitride semiconductor laser element has a long life and a high reliability.

BRIEF DESCRIPTION OF DRAWINGS

FIG. 2 is a cross-sectional view of the nitride semiconductor laser element according to the first embodiment of the present invention.

FIG. 3A is a schematic cross-sectional view of the nitride semiconductor laser element at a step of forming an end face protection film according to the first embodiment of the present invention.

DESCRIPTION OF EMBODIMENT(S)

The following describes the embodiments according to the present invention with reference to the drawings.

First Embodiment

The following describes the first embodiment of the present invention with reference to the drawings.

A structure and a manufacturing method of a nitride semiconductor laser element according to the first embodiment are described below. The nitride semiconductor laser element according to the first embodiment is assumed to be a gallium nitride (GaN) blue-violet laser device that emits laser light having a center wavelength in a range from 390 nm to 430 nm.

Figure 1A:
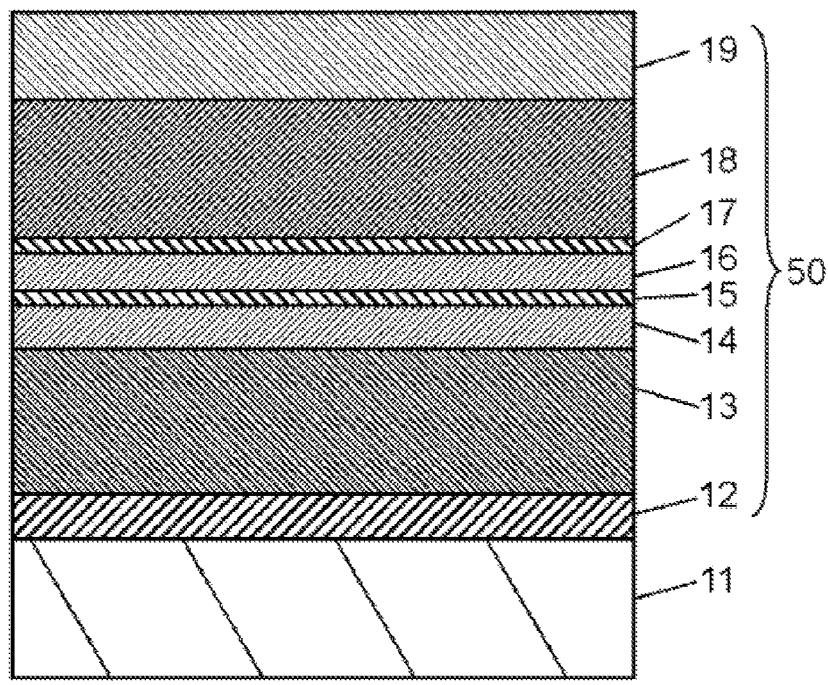
FIG. 1A is a cross-sectional view of a nitride semiconductor laser element in a manufacturing process according to a first embodiment of the present invention.

First, with reference to FIG. 1A, a multi-layer structure of the nitride semiconductor laser element according to the present embodiment is described. In order to form the multi-layer structure of the nitride semiconductor laser element, MOCVD (Metal Organic Chemical Vapor Deposition), for example, is used. Semiconductor multi-layer structure 50 is epitaxially grown on n-type substrate 11 comprising n-type GaN by the MOCVD. Resulting semiconductor multi-layer structure 50 includes a plurality of group III nitride semiconductors.

Details are given below as an example. N-type substrate 11 is n-type GaN with a main surface having a C (0001) plane orientation. N-type semiconductor layer 12, n-type cladding layer 13, n-type light guide layer 14, multiple quantum well active layer 15, p-type light guide layer 16, p-type electron block layer 17, p-type cladding layer 18, and p-type contact layer 19 are sequentially grown on the main surface of n-type substrate 11. N-type semiconductor layer 12 comprises n-type GaN having a thickness of approximately 1 μm and Si (silicon) concentration of $1 \times 10^{18}$ cm$^{-3}$. Here, Si is n-type dopant. N-type cladding layer 13 comprises n-type $Al_{0.05}Ga_{0.95}N$ having a thickness of approximately 1.5 μm and Si concentration of $5 \times 10^{17}$ cm$^{-3}$. N-type light guide layer 14 comprises an n-type GaN having a thickness of approximately 0.1 μm and Si concentration of $5 \times 10^{17}$ cm$^{-3}$. Multiple quantum well active layer 15 comprises InGaN. P-type light guide layer 16 comprises p-type GaN having a thickness of approximately 0.1 μm and Mg (magnesium) concentration of $1 \times 10^{19}$ cm$^{-3}$. Here, Mg is p-type dopant. P-type electron block layer 17 comprises p-type $Al_{0.2}Ga_{0.8}N$ having a thickness of approximately 10 nm and Mg concentration of $1 \times 10^{19}$ cm$^{-3}$. P-type cladding layer 18 comprises p-type AlGaN. P-type contact layer 19 comprises p-type GaN having a thickness of approximately 20 nm and Mg concentration of $1 \times 10^{20}$ cm$^{-3}$.

Here, multiple quantum well active layer 15 has a double quantum well structure that includes a well layer and a barrier layer. The well layer comprises undoped InGaN having a thickness of approximately 7 nm. The barrier layer comprises undoped $In_{0.02}Ga_{0.98}N$ having a thickness of 20 nm. Composition of In (Indium) in the well layer is adjusted to result in an oscillation wavelength of, for example, 405 nm.

It should be noted that p-type electron block layer 17 may be provided between multiple quantum well active layer 15 and p-type light guide layer 16.

It is also possible that p-type cladding layer 18 is a p-type superlattice cladding layer having a total thickness of 0.5 μm. For example, the p-type superlattice cladding layer has a superlattice structure comprising a p-type $Al_{0.1}Ga_{0.9}N$ layer and a p-type GaN layer, each of which has Mg concentration of $1 \times 10^{19}$ cm$^{-3}$ and a thickness of approximately 2 nm.

Figure 1B:
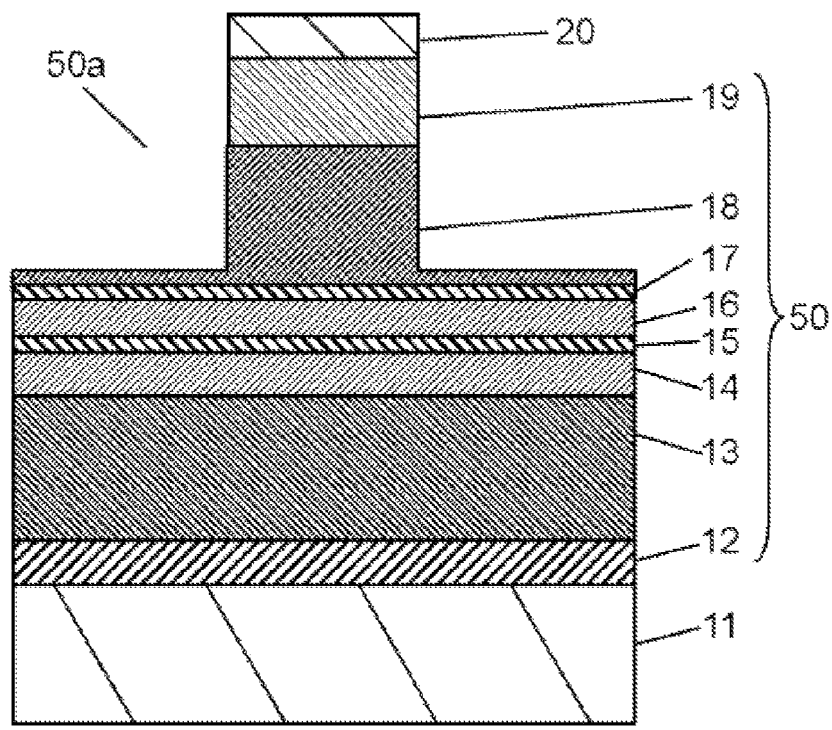
FIG. 1B is a cross-sectional view of the nitride semiconductor laser element in the manufacturing process according to the first embodiment of the present invention.

Next, referring to FIG. 1B, the description is given for a structure and a manufacturing method of ridged waveguides in the nitride semiconductor laser element according to the present embodiment. As illustrated in FIG. 1A, on p-type contact layer 19 in semiconductor multi-layer structure 50 in FIG. 1A, mask layer 20 comprising $SiO_2$ (silicon oxide) is formed. Subsequently, lithography and etching are performed to pattern mask layer 20 into stripes extending in a <1-100> direction with respect to a crystal axis of n-type substrate 11. Then, dry etching is performed on p-type contact layer 19 and p-type cladding layer 18 according to striped mask layer 20. As a result, ridged waveguides 50a are formed out of p-type contact layer 19 and p-type cladding layer 18 to have a striped shape extended in the <1-100> direction with respect to the crystal axis.

Here, a thickness (remaining thickness) of a side part of each ridged waveguide 50a in p-type cladding layer 18 is, for example, approximately 0.1 μm. A width of a lower part of each ridged waveguide 50a is, for example, approximately 10 μm. A width of an upper part of each ridged waveguide 50a is, for example, approximately 8 μm.

Next, referring to FIG. 2, a structure and a manufacturing method of nitride semiconductor laser element 1 according to the present embodiment is described. As illustrated in FIG. 2, after removing mask layer 20 illustrated in FIG. 1B, lithography, vacuum evaporation, and the like are performed on p-type contact layer 19 serving as ridged waveguides 50a to form P-side electrode 21. P-side electrode 21 is a multi-layer film including, for example, a palladium (Pd) film and a platinum (Pt) film. Subsequently, n-type substrate 11 is processed to be thinner (by polishing the rear face) to make cleavage easier. After that, on the rear face of n-type substrate 11, N-side electrode 22 is formed. N-side electrode 22 is a multi-layer film including, for example, a titanium (Ti) film and a gold (Au) film.

Subsequently, n-type substrate 11 and semiconductor multi-layer structure 50 are cleaved, so that a resonator formed under each ridged waveguide 50a of semiconductor multi-layer structure 50 has a length, for example, in a range from approximately 600 μm to approximately 2000 μm, or desirably approximately 800 μm or approximately 1200 μm. The cleavage forms an end face mirror having a (1-100) plane orientation in semiconductor multi-layer structure 50.

The end face mirror includes front end face 28 and rear end face 29 which face each other. Front end face 28 is a surface from which laser light is outputted. Rear end face 29 is a surface on which the laser light is reflected.

For the sake of convenience in the Description, a minus sign "−" added to an index of a crystal axis or a plane orientation indicates a reverse of the index following the minus sign. For example, (1-100) is expressed by following mathematical formula 1.

$$(1\bar{1}00) \quad [\text{Math. 1}]$$

Likewise, a direction, for example, <1-100>, is expressed by following mathematical formula 2.

$$<1\bar{1}00> \quad [\text{Math. 2}]$$

After that, on each end face of the nitride semiconductor laser element, a multi-layer protection film is formed to prevent deterioration of the end face of semiconductor multi-layer structure 50 and also to adjust a reflectance of the end face even in high light-output operation. More specifically, as illustrated in FIG. 2, multi-layer protection film 30 is provided on front end face 28 from which laser light is outputted. Multi-layer protection film 30 on the front end face has a multi-layer structure that includes end face protection layer 31 and oxygen diffusion suppression layer 32. Here, end face protection layer 31 includes protection film 33 that is a crystalline aluminum nitride (AlN) film. On protection film 33, there is oxygen diffusion suppression layer 32 having a multi-layer structure. Oxygen diffusion suppression layer 32 includes silicon oxide film 34, silicon oxide film 36, and metal oxide film 35. Metal oxide film 35 is provided between silicon oxide film 34 and silicon oxide film 36. Metal oxide film 35 comprises, more specifically, aluminum oxide ($Al_2O_3$).

On the other hand, on rear end face 29 facing front end face 28, there is multi-layer protection film 25 having a multi-layer structure. Multi-layer protection film 25 includes pairs of an aluminum oxide ($Al_2O_3$) film and a zirconium oxide ($ZrO_2$) film. However, as long as a desired reflectance is obtained, the rear end face may have any multi-layer structure that includes, for example, pairs of $SiO_2$ and $ZrO_2$, pairs of AlON and $SiO_2$, pairs of $Al_2O_3$ and $SiO_2$, or pairs of AlN and $SiO_2$. Here, like the protection film on front end face 28, in particular, a first protection film on rear end face 29 is desirably an AlN film. An AlN film is robust and has a high heat conductivity enough to serve as a reliable protection film even on the rear end face from which light is not outputted.

The multi-layer protection film on front end face 28 is designed to have a reflectance in a range from approximately 1% to approximately 15%. The multi-layer protection film on rear end face 29 is designed to have a reflectance in a range from approximately 90% to approximately 100%. The above reflectance is obtained by appropriately designing the thickness of each of the protection films for the front end face and the rear end face.

Furthermore, protection film 33 comprising AlN, silicon oxide film 34, silicon oxide film 36, and metal oxide film 35 comprising $Al_2O_3$, which are included in the multi-layer protection film, are formed by ECR (Electron Cyclotron Resonance) sputtering. The ECR sputtering is capable of forming the multi-layer protection films without irradiating sputtering ions directly on the front end face and the rear end face which are formed by cleavage. It is therefore possible to prevent the ion irradiation from damaging the semiconductor surfaces and increasing crystal defects. For the above reason, the ECR sputtering is desirable as a method of forming coat films on end faces of semiconductor laser elements. However, if the influence of the above damage is small enough, it is also possible to use not only the ECR sputtering but also RF (Radio Frequency) sputtering or magnetron sputtering.

Referring to FIGS. 3A to 3D, the following describes a method of manufacturing the nitride semiconductor laser element, and a detailed method of manufacturing multi-layer protection film 30 on the front end face and multi-layer protection film 25 on rear end face. In the present embodiment, as one example of the manufacturing method, the method employs the ECR sputtering to form multi-layer protection film 30 on the front end face and multi-layer protection film 25 on the rear end face.

Figure 3B:
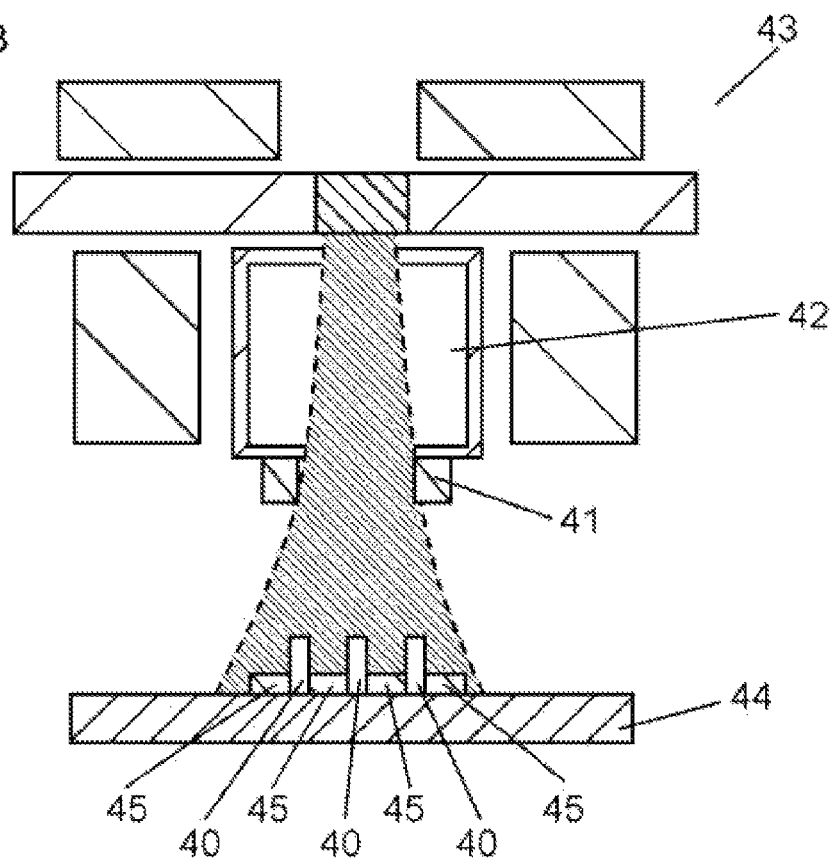
FIG. 3B is a schematic cross-sectional view of the nitride semiconductor laser element at the step of forming the end face protection film according to the first embodiment of the present invention.
Figure 3C:
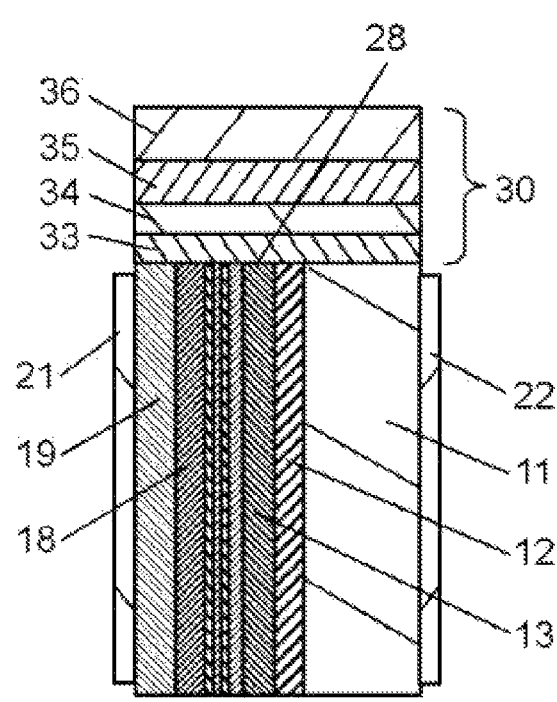
FIG. 3C is a schematic cross-sectional view of the nitride semiconductor laser element at the step of forming the end face protection film according to the first embodiment of the present invention.

First, as illustrated in FIG. 3A, semiconductor multi-layer structure 50, which is on n-type substrate 11 and has P-side electrode 21 and N-side electrode 22, is cleaved to form laser bar sample 40 having a light-emitting end face of the semiconductor laser element. Here, the laser bar sample refers to a state where a plurality of semiconductor laser elements share the same end face before dividing the laser bar sample into the semiconductor laser elements. Then, laser bar samples 40 are placed in ECR sputtering device 43. FIG. 3B illustrates a schematic diagram of an arrangement of laser bar samples 40 in ECR sputtering device 43. In the region where films are to be formed by ECR sputtering, a dielectric film is formed on the light-emitting surface as a film-forming surface. More specifically, the films are formed in the following manner. First, in ECR sputtering device 43, a plurality of laser bar samples 40 are placed on stage 44 by using jigs 45. Each of laser bar samples 40 is arranged so that the front end face faces target materials 41 for sputtering. As illustrated in FIG. 3C, by using plasma flow produced in plasma producing chamber 42, AlN films and the others films are formed on/above front end face 28 to manufacture multi-layer protection film 30 for the front end face. Next, as illustrated in 3D, each of laser bar samples 40 is arranged so that rear end face 29 faces target materials 41. Then, AlN film and the other films are formed on/above the rear end face to manufacture multi-layer protection film 25 for the rear end face. Here, in order to protect the light-emitting surface, it is desirable to form the multi-layer protection film on the front end face prior to forming of the multi-layer protection film on the rear end face.

Next, the multi-layer protection films on the front end face and the rear end face according to the present embodiment are described in more detail. The AlN films included in the end face protection layers can be formed by reactive sputtering that uses a combination of target material 41, which is AlN or Al, and nitrogen ($N_2$) gas. In the present embodiment, the material target is a metal target material comprising Al that easily enhances purity by metal refining. The Al metal target is combined with argon (Ar) as reference gas and nitrogen gas as reactive gas. The use of an Al material target makes it possible to form $Al_2O_3$ films sequentially without exchanging target materials, by changing reactive gas from nitrogen to oxygen.

In the present embodiment, protection film 33 (AlN film) is formed to have a thickness of approximately 30 nm. Having a high film stress, an AlN film is peeled when the AlN film has a thickness of 50 nm or more on a cleavage end face of laser bar sample 40. Therefore, it is desirable that the thickness of protection film 33 (AlN film) in end face protection layer 31 is 50 nm or less. Furthermore, in order to suppress heat caused by light absorption, it is desirable to set a light path to be short in the AlN film. Also for this reason, the thickness of protection film 33 (AlN film) in end face protection layer 31 is desirably 50 nm or less. On the other hand, if the formed AlN film is thin with a thickness of less than 5 nm, oxygen and the like easily transmits through the AlN film. As a result, the end face of laser bar sample 40 is oxidized. Furthermore, if the thickness of the AlN film is less than 5 nm, thickness control is difficult in manufacturing. As a result, the thickness varies. Therefore, it is desirable that protection film 33 (AlN film) in end face protection layer 31 has a thickness in a range from 5 nm to 50 nm, and preferably approximately 30 nm as described in the present embodiment.

Regarding film forming conditions, the AlN film as protection film 33 according to the present embodiment is formed at a room temperature with argon (Ar) gas flow rate of 30 ml/min and nitrogen ($N_2$) gas flow rate of 4.7 ml/min. As a result, the AlN film is formed robust.

The silicon oxide films ($SiO_2$ films) and the metal oxide film ($Al_2O_3$ film) in oxygen diffusion suppression layer 32 according to the present embodiment are formed also by ECR sputtering. In the ECR sputtering, each of the $SiO_2$ films is formed by using a combination of a Si target as a target material and Ar and oxygen as reactive gas. The $Al_2O_3$ film is formed by using a combination of an Al metal target as a target material and Ar and oxygen as reactive gas. According to the present embodiment, oxygen diffusion suppression layer 32 can be thereby easily formed.

In the present embodiment, regarding film forming conditions, each of silicon oxide film 34 ($SiO_2$ film) on the AlN film and outermost silicon oxide film 36 ($SiO_2$ film) is formed with Ar gas flow rate of 30 ml/min and oxygen ($O_2$) gas flow rate of 7.9 ml/min. Metal oxide film 35 ($Al_2O_3$ film) between silicon oxide films ($SiO_2$ films) 34 and 36 is formed with Ar gas flow rate of 20 ml/min and oxygen ($O_2$) gas flow rate of 4.9 ml/min as film forming conditions.

Figure 4:
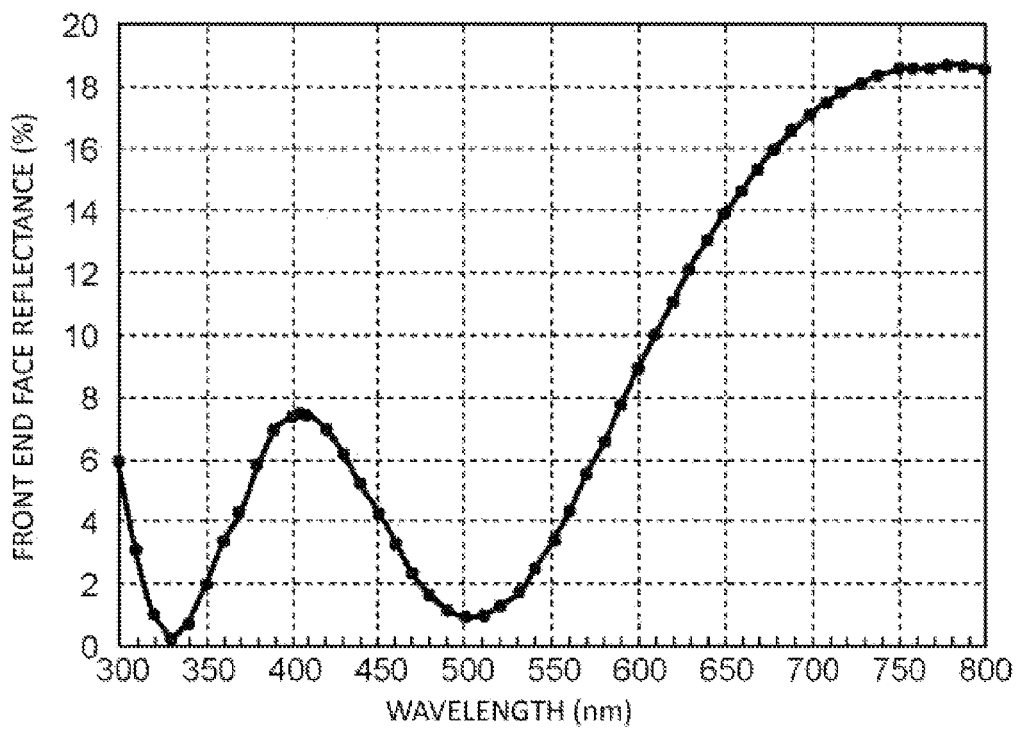
FIG. 4 is a graph plotting a reflectance spectrum of a multi-layer protection film on a front end face of the nitride semiconductor laser element according to the first embodiment of the present invention.

The thickness of each of the films in multi-layer protection film 30 on the front end face according to the present embodiment is adjusted so that the light-emitting surface has a reflectance of approximately 7%. More specifically, the thickness of silicon oxide film ($SiO_2$ film) 34 is set to 100 nm, the thickness of silicon oxide film ($SiO_2$ film) 36 is set to 70 nm, and the thickness of the metal oxide film ($Al_2O_3$ film) is set to 80 nm. FIG. 4 shows an end face reflectance spectrum of multi-layer protection film 30 on the front end face as a light-emitting surface according to the present embodiment. Here, the reflection spectrum of multi-layer protection film 30 on the front end face is designed to have a maximum value when the nitride semiconductor laser element has an oscillation wavelength of approximately 405 nm. As described above, if the reflectance with respect to the oscillation wavelength of the multi-layer protection film on the front end face is adjusted to an extreme value in the reflectance spectrum, it is possible to reduce variations of the reflectance that varies depending on variations of a thickness or on variations of a refractive index in the film forming process.

Furthermore, the thickness of each of the films in multi-layer protection film 25 on the rear end face according to the present embodiment is designed to result in a reflectance of approximately 95%.

Figure 3D:
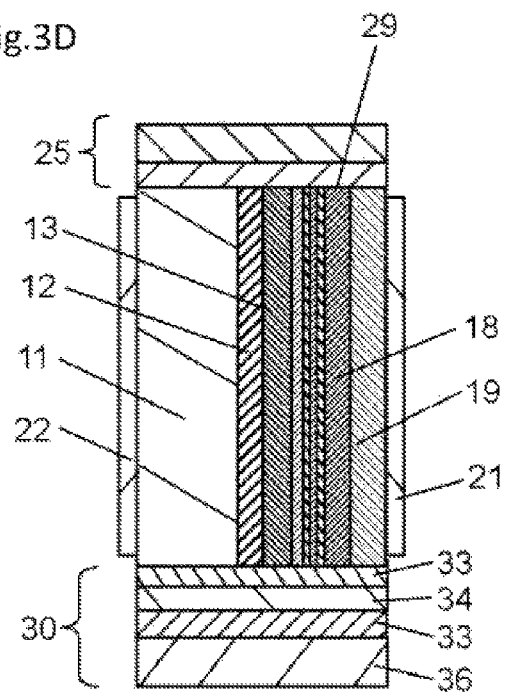
FIG. 3D is a schematic cross-sectional view of the nitride semiconductor laser element at the step of forming the end face protection film according to the first embodiment of the present invention.

As described previously in detail, multi-layer protection film 30 on the front end face is formed, by ECR sputtering, on front end face 28 of each laser bar sample 40 as illustrated in FIG. 3C. In the same manner, on rear end face 29, multi-layer protection film 25 for the rear end face is formed by ECR sputtering. Then, laser bar sample 40 is divided by cleavage into a plurality of nitride semiconductor laser elements so as to manufacture nitride semiconductor laser elements 1 each of which is as illustrated in FIG. 3D.

Figure 5:
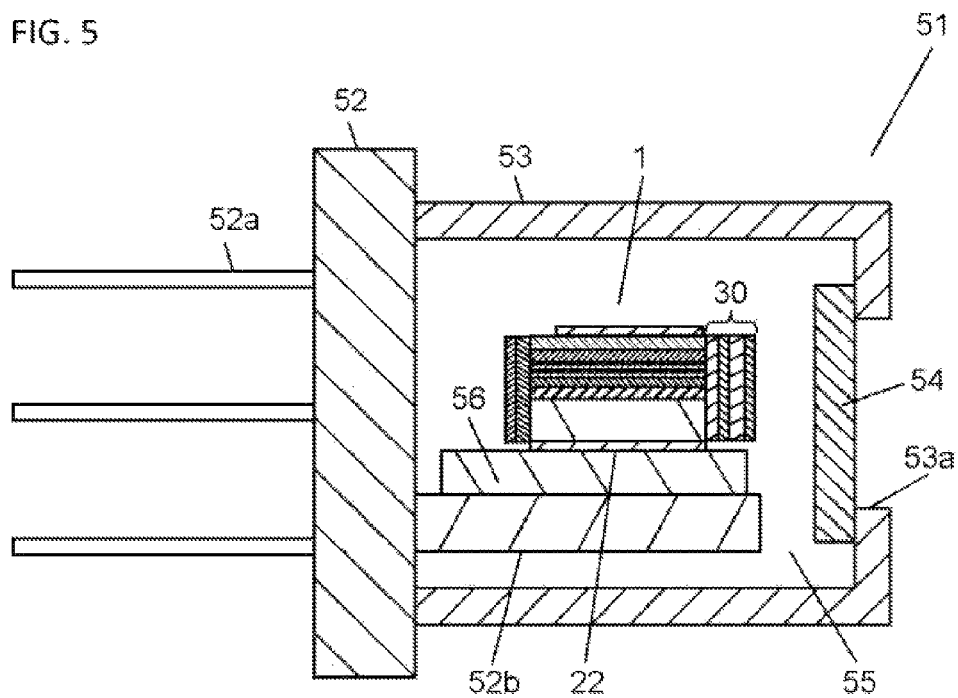
FIG. 5 is a cross-sectional view of a nitride semiconductor laser device in which the nitride semiconductor laser element is accommodated, according to the first embodiment of the present invention.

Next, referring to FIG. 5, the description is given for nitride semiconductor laser device 51 in which nitride semiconductor laser element 1 is accommodated. As illustrated in FIG. 5, for example, nitride semiconductor laser device 51 has stem 52 comprising a metal. Stem 52 has one surface with a plurality of electrode terminals 52a, and another surface with laser holding unit 52b. Nitride semiconductor laser element 1 is fixed to laser holding unit 52b of metal stem 52 via sub mount 56. Stem 52 is fixed with metal cap 53. Cap 53 covers nitride semiconductor laser element 1 and laser holding unit 52b. Cap 53 has window part 53a facing multi-layer protection film 30 on the front end face of nitride semiconductor laser element 1. Glass plate 54 is fixed to window part 53a from the inside of cap 53. A space enclosed by stem 52, cap 53, and glass plate 54 is sealed. The sealed space in which nitride semiconductor laser element 1 is located is filled with sealing gas 55. Sealing gas 55 includes dry air without water, or rare gas such as argon.

As described previously, protection film 33 (AlN film) and metal oxide film 35 ($Al_2O_3$ film) are separated from each other via silicon oxide film 34 ($SiO_2$ film). Therefore, if metal oxide film 35 ($Al_2O_3$ film) is crystallized by laser light outputted from the light-emitting end face, the crystallization increases a density of metal oxide film 35 ($Al_2O_3$ film). The density increase blocks oxygen diffusion to suppress deterioration inside the multi-layer protection film. As a result, it is possible to manufacture the nitride semiconductor laser element with high output and a long life.

The effects and the mechanism according to the present embodiment of the present invention are described in more detail in the following second embodiment.

Second Embodiment

Next, referring to FIGS. 6 to 13B, the nitride semiconductor laser element according to the second embodiment of the present invention is described. It should be noted that the same reference numerals in the first embodiment are assigned to the identical structural elements in the second embodiment, so that the identical elements are not described again.

Figure 6:
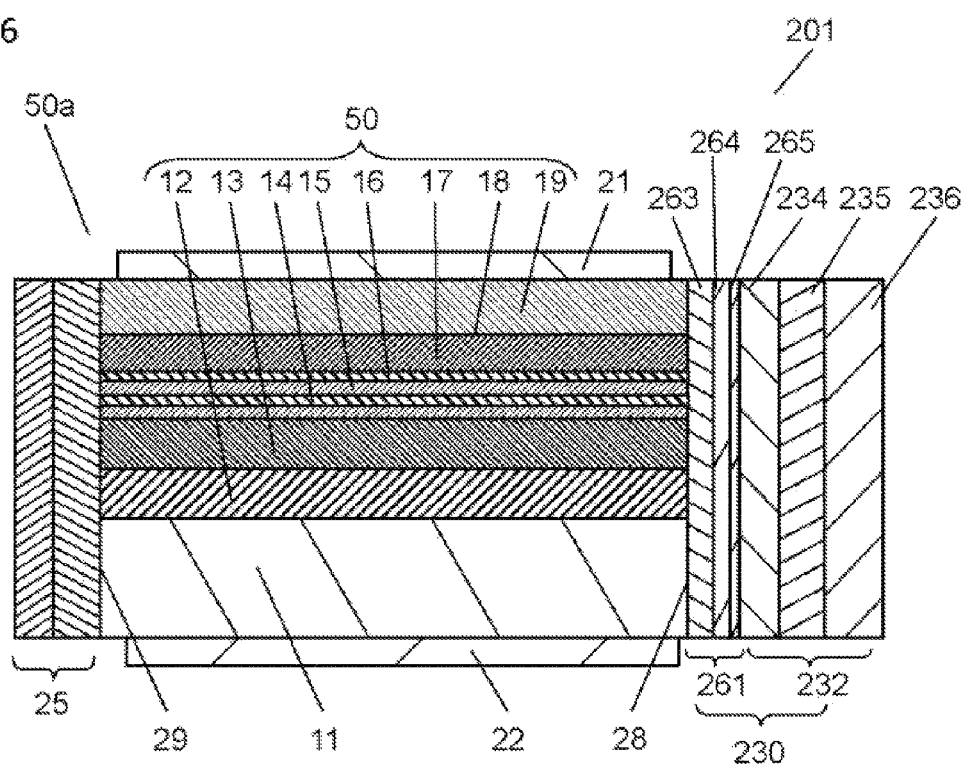
FIG. 6 is a cross-sectional view of a nitride semiconductor laser element according to a second embodiment of the present invention.

FIG. 6 is a schematic cross-sectional view of nitride semiconductor laser element 201 according to the second embodiment of the present invention. In the same manner as described in the first embodiment, on front end face 28 of semiconductor multi-layer structure 50, there is multi-layer protection film 230 that includes end face protection layer 261 and oxygen diffusion suppression layer 232. End face protection layer 261 has a three-layer structure. In the three-layer structure, an AlN film is on front end face 28 to serve as first protection film 263. Above the AlN film, there is a metal oxide film that is an $Al_2O_3$ film serving as second protection film 264. Another AlN film is formed as third protection film 265 covering second protection film 264. Oxygen diffusion suppression layer 232 has the same structure as described in the first embodiment. In oxygen diffusion suppression layer 232, metal oxide film ($Al_2O_3$ film) 235 is between silicon oxide films ($SiO_2$ films) 234 and 236. The silicon oxide film and the $Al_2O_3$ films serving as the metal oxide films, and the further $SiO_2$ film are formed by the same method as described in the first embodiment. The thickness of each of the films in multi-layer protection film 230 on the front end face is designed so that multi-layer protection film 230 on the front end face has a reflectance of 6%. More specifically, for example, first protection film (AlN film) 263 having a thickness of 20 nm, second protection film ($Al_2O_3$ film) 264 having a thickness of 10 nm, third protection film (AlN film) 265 having a thickness of 15 nm, silicon oxide film ($SiO_2$ film) 234 having a thickness of 89 nm, metal oxide film ($Al_2O_3$ film) 235 having a thickness of 89 nm, and silicon oxide film ($SiO_2$ film) 236 having a thickness of 235 nm are formed sequentially from the front end face. Furthermore, when nitride semiconductor laser element 201 is accommodated in the nitride semiconductor laser device, nitride semiconductor laser element 201 is provided on stem 52 in the same manner as described in the first embodiment.

Here, while first protection film (AlN film) 263 has high single crystalline that is mainly m-axis orientated, third protection film (AlN film) 265 is a polycrystalline film that is mainly c-axis orientated.

In the above structure, third protection film (AlN film) 265 and metal oxide film ($Al_2O_3$ film) 235 are separated from each other via silicon oxide film ($SiO_2$ film) 234. Therefore, when metal oxide film ($Al_2O_3$ film) 235 is crystallized by laser light outputted from the light-emitting end face, the crystallization increases a density of metal oxide film ($Al_2O_3$ film) 235. The density increase blocks oxygen diffusion to suppress deterioration inside the multi-layer protection film. As a result, it is possible to manufacture the nitride semiconductor laser element with high output and a long life.

As described earlier, first protection film (AlN film) 263 has m-axis orientation, and third protection film (AlN film) 265 has c-axis orientation. First protection film (AlN film) 263 with m-axis orientation produces substrate effects to make metal oxide film ($Al_2O_3$ film) 264 a high-density crystalline film. Third protection film (AlN film) 265 with c-axis orientation can relax a stress caused in the multi-layer protection film on the front end face. Therefore, the multi-layer protection film on the front end face is able to block oxygen transmission and prevent peeling caused by crystallization.

Figure 7:
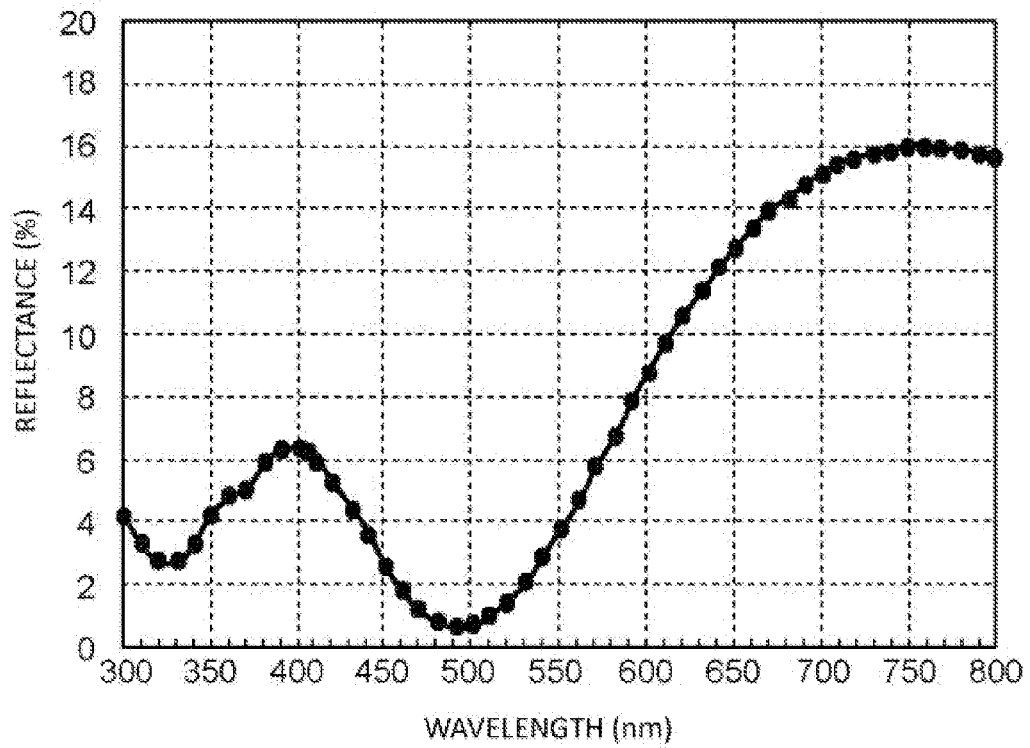
FIG. 7 is a graph plotting a reflectance spectrum of a multi-layer protection film on a front end face of the nitride semiconductor laser element.

In the above-described structure, in the same manner as described for the nitride semiconductor laser element according to the first embodiment, the front end face is designed to have a maximum reflectance with respect to an oscillation wavelength in a reflectance spectrum. FIG. 7 shows the reflectance spectrum of the front end face of the nitride semiconductor laser element according to the second embodiment. A film thickness is set to result in a maximum reflectance with an oscillation wavelength of 410 nm. The above-described structure can reduce variations of the reflectance that varies depending on thickness variations in manufacturing. As a result, it is possible to decrease variations of characteristics of the semiconductor laser.

Meanwhile, if the nitride semiconductor laser element is operated for a long time, optical crystallization occurs to increase a film density of the metal oxide film in the multi-layer protection film on the front end face. The increase of the film density increases a refractive index of the metal oxide film from 0.05 to approximately 0.1. Even in the above situation, it is possible to reduce variations of characteristics of the nitride semiconductor laser element. More specifically, the reflection spectrum of the multi-layer protection film on the front end face is adjusted to obtain a maximum reflectance with respect to an oscillation wavelength. As a result, even if the refractive index is varied as described above, variations of characteristics of the semiconductor laser can be suppressed. It is therefore possible to ensure stable laser characteristics even in high output operation, and eventually provide the nitride semiconductor laser element with high output and a high reliability.

Next, the effects and the mechanism according to the present embodiment of the present invention are described in more detail with reference to experimental data.

It should be noted that the mechanism according to the second embodiment of the present invention is the same as that described in the first embodiment.

(1) Comparison Example

First, a nitride semiconductor laser element according to the first comparison example having a conventional structure is described. On a front end face of the nitride semiconductor laser element according to the first comparison example, there is a multi-layer protection film that includes a first end face protection film, a second end face protection film, and a third end face protection film. The first end face protection film is a crystalline AlN film provided on the front end face. The second end face protection film comprises $Al_2O_3$ and is provided on the first end face protection film. The third end face protection film is provided on the second end face protection film.

Figure 8:
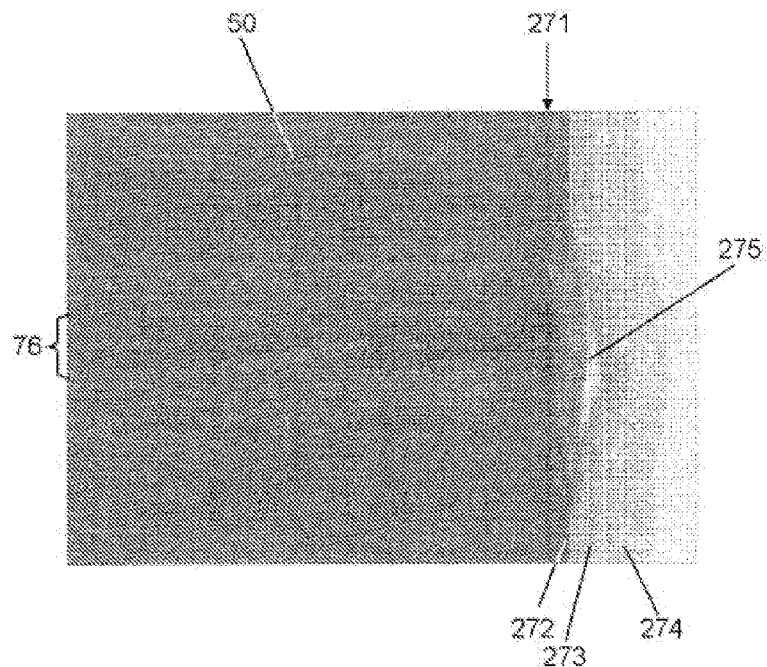
FIG. 8 is a cross-sectional transmission electron beam image of a nitride semiconductor laser element after being aged, according to a first comparison example.

FIG. 8 is a cross-sectional TEM (Transmission Electron Microscopy) image of a vicinity of the front end face after performing an aging test for 1000 hours with Watt-class light output on the nitride semiconductor laser element according to the first comparison example. The following describes the structure of the multi-layer protection film on the front end face in more detail. The multi-layer protection film on the front end face has a three-layer structure. The multi-layer protection film includes first end face protection film 272, second end face protection film 273, and third end face protection film 274. First end face protection film 272 is provided on front end face 271. First end face protection film 272 is a crystalline film comprising AlN having a thickness of 30 nm. Second end face protection film 273 is an $Al_2O_3$ film having a thickness of 45 nm. Third end face protection film 274 is a $SiO_2$ film having a thickness of 65 nm. This structure causes the multi-layer protection film on the front end face to have a reflectance of approximately 6%. These three end face protection films are sequentially formed by ECR sputtering. It should be noted that gas flow rates in forming of these films are the same as those described in the first embodiment. The aging test is performed with fixed current application, at a case temperature of 60° C., and with an operation current of 1.3 A, as current application conditions. Here, an initial light output is approximately 2 W.

FIG. 8 shows that first end face protection film (AlN film) 272 and second end face protection film ($Al_2O_3$ film) 273 have high solid-phase reaction. Furthermore, the solid-phase reaction causes film peeling 275. Such solid-phase reaction and film peeling cause light absorption and light diffusion of laser light in a laser light emitting part of the nitride semiconductor laser element. As a result, significant optical loss occurs on the end face. In particular, light absorption causes local heating on the end face and therefore reduces a band gap. As a result, light absorption inside GaN crystals is increased. It is supposed that resulting temperature increase and positive feedback of the light absorption would increase a temperature at the end face at an accelerating pace, thereby causing local deterioration near the end face. More specifically, a part of active layer 76 near the front end face has turbulence in the structure. The turbulence in the active layer is supposed to be caused by diffusion of In in an InGaN quantum well, which would result from the above-described temperature increase on the end face caused by the deterioration of the end face protection film.

Figure 9A:
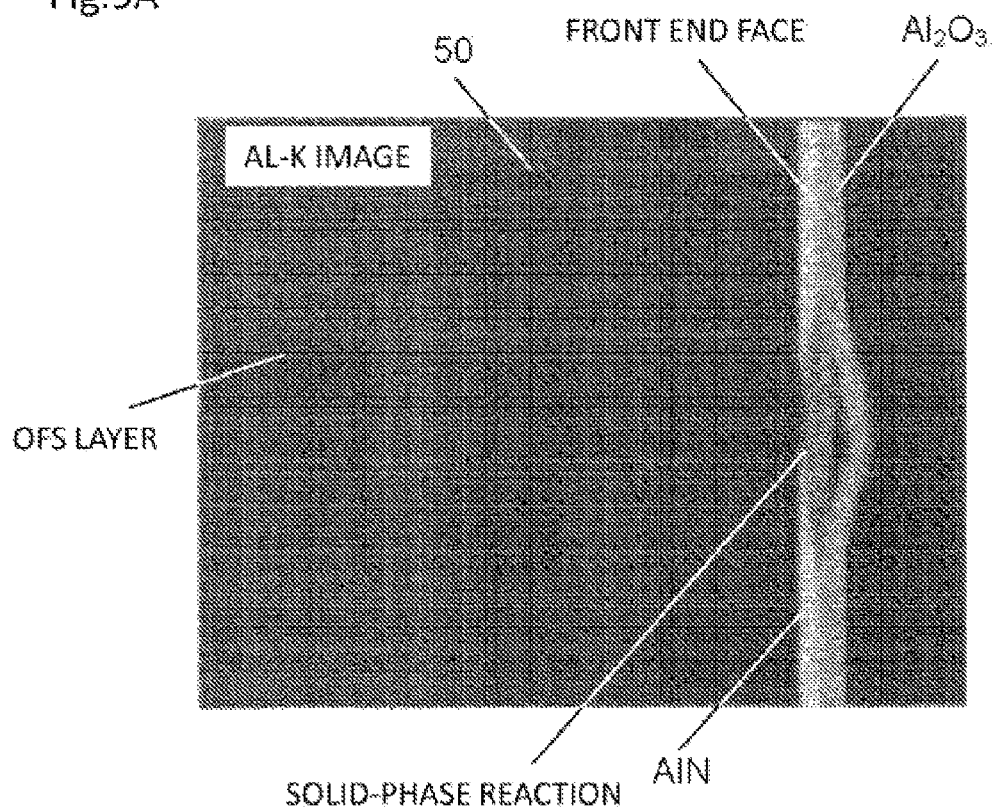
FIG. 9A shows distribution of aluminum composition in a vicinity of a light-emitting end face of the nitride semiconductor laser element after being aged, according to the first comparison example.
Figure 9B:
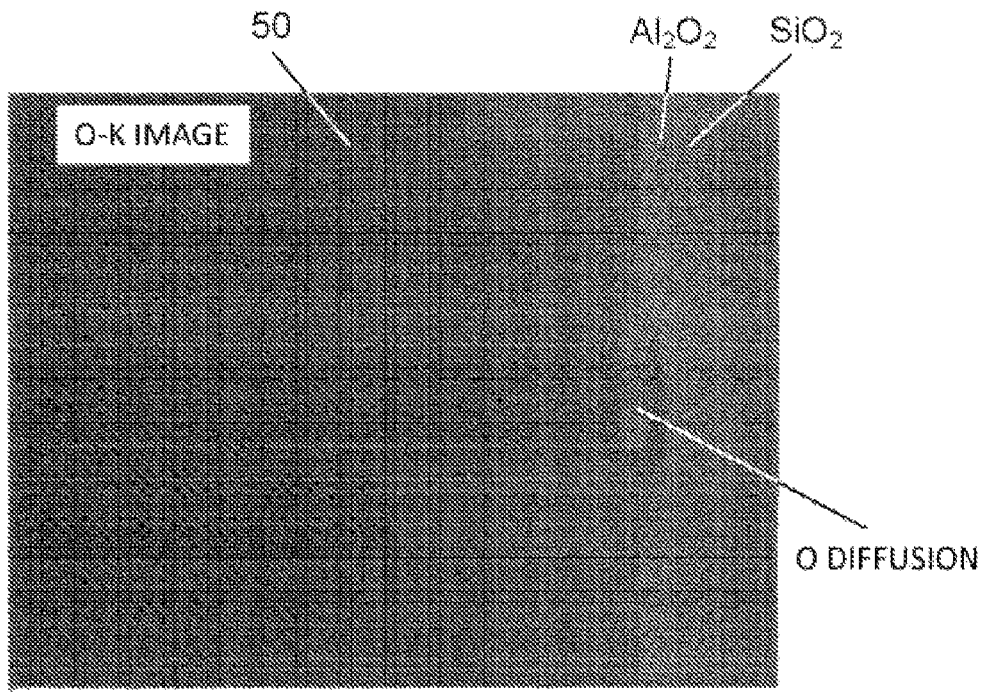
FIG. 9B shows distribution of oxygen composition in a vicinity of the light-emitting end face of the nitride semiconductor laser element after being aged, according to the first comparison example.

FIG. 9A shows distribution of aluminum (Al) composition in the end face region shown in FIG. 8. FIG. 9B shows distribution of oxygen (O) composition in the end face region shown in FIG. 8. As seen in FIG. 9A, the AlN film is distinguished from the $Al_2O_3$ film according to a difference of Al density. However, in the light-emitting region, a boundary between the AlN film and the $Al_2O_3$ film is not clear. This shows that solid-phase reaction progresses in the light-emitting region. Referring to FIG. 9B, oxygen is considerably diffused to the AlN film only in the light-emitting region. As a result, it is possible to conclude that the deterioration phenomenon of the end face protection film, which is caused by the aging test, is oxidation reaction in the AlN film which causes oxygen diffusion (oxidation reaction). As explained above, the oxygen diffusion and the oxidation reaction are main factors of causing end face deterioration. The results show that the end face deterioration progresses in Watt-class high light-output even if an AlN film serves as an end face protection film as disclosed in the conventional technique.

(2) Advantages of Nitride Semiconductor Laser Element According to the Present Invention In order to suppress the end face deterioration in high light output operation, such as Watt-class light output, it is necessary to suppress oxygen diffusion and solid-phase reaction more than the conventional techniques do. The structure according to the present embodiment of the present invention is capable of suppressing oxygen diffusion by optical-crystallizing the $Al_2O_3$ film in the oxygen diffusion suppression layer.

Figure 10:
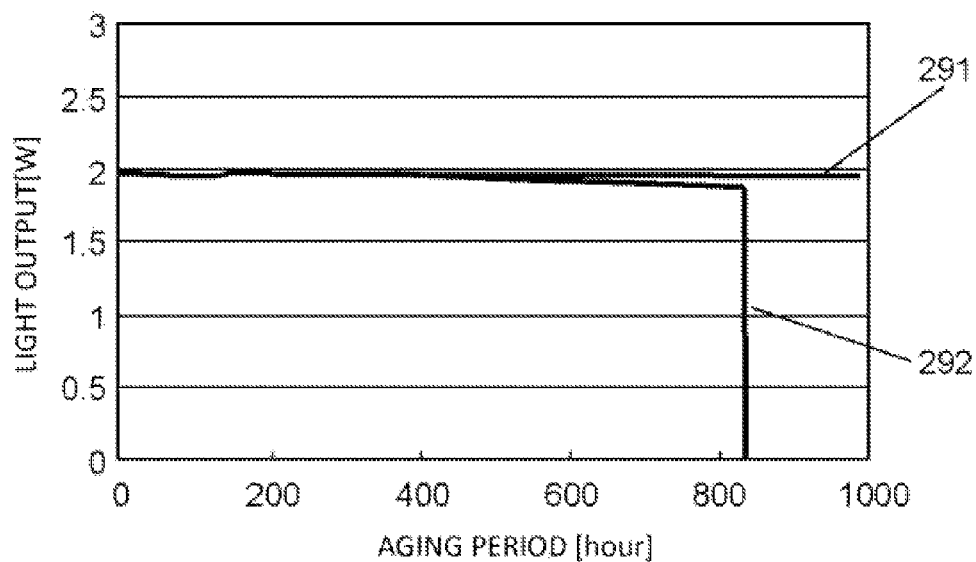
FIG. 10 is a graph of deterioration curves in aging tests, comparing the nitride semiconductor laser element according to the present invention to a nitride semiconductor laser element according to a second comparison example.
Figure 11A:
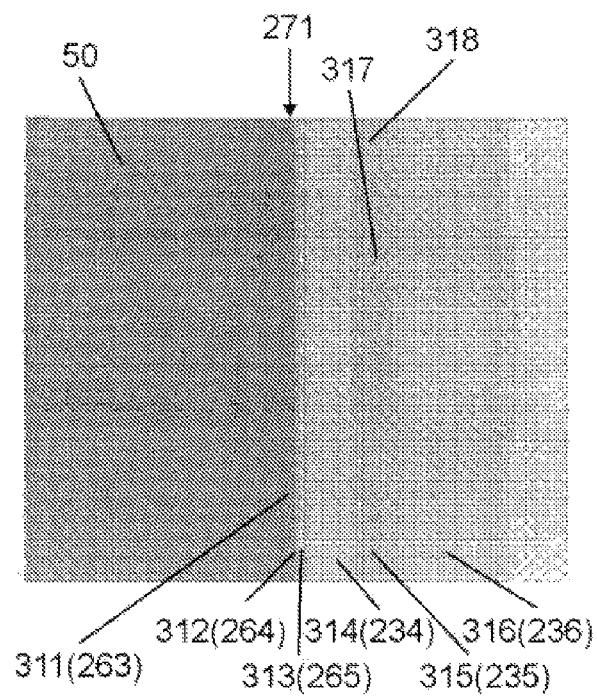
FIG. 11A is a cross-sectional transmission electron beam image of a vicinity of the light-emitting end face of the nitride semiconductor laser element after being aged, according to the present invention.

FIG. 10 is a graph plotting a relationship between a light output and a time in an aging test, comparing the nitride semiconductor laser element according to the present embodiment to a nitride semiconductor laser element according to the second comparison example. Deterioration curve 291 seen in the graph is a deterioration curve of a light output of the nitride semiconductor laser element having the end face protection film structure described in the second embodiment of the present invention. FIG. 11A is a cross-sectional photograph of a vicinity of the end face of the nitride semiconductor laser element according to the second embodiment of the present invention. Referring to FIG. 11A, AlN film 311 corresponding to first protection film 263, $Al_2O_3$ film 312 corresponding to metal oxide film 264, AlN film 313 corresponding to third protection film 265, $SiO_2$ film 314 corresponding to silicon oxide film 234, $Al_2O_3$ film 315 corresponding to metal oxide film 235, and $SiO_2$ film 316 corresponding to silicon oxide film 236 are formed on/above front end face 271, being arranged sequentially in this order from semiconductor multi-layer structure 50.

Figure 11B:
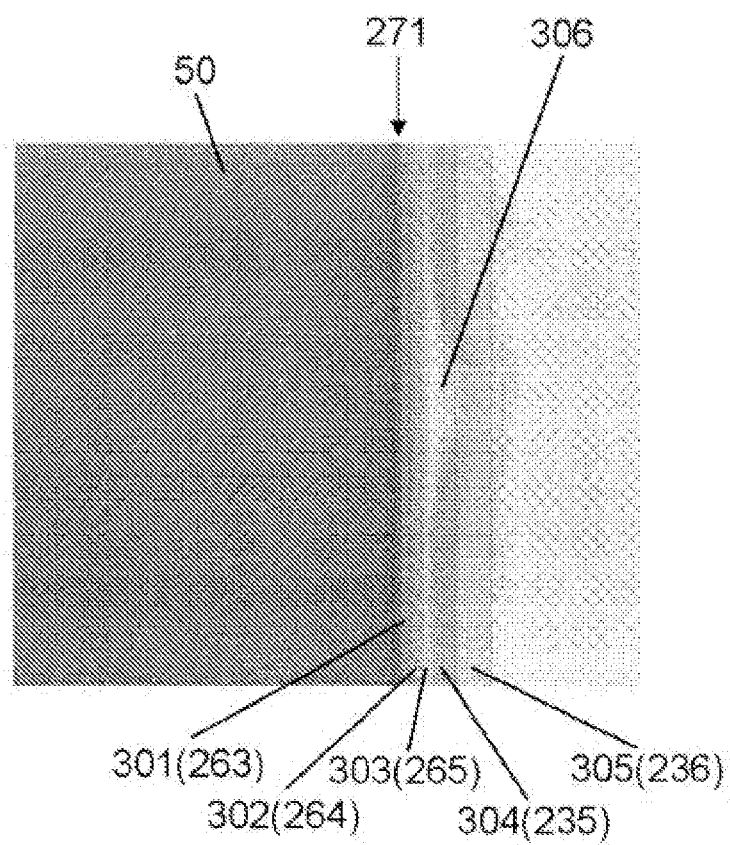
FIG. 11B is a cross-sectional transmission electron beam image of a vicinity of a light-emitting end face of the nitride semiconductor laser element after being aged, according to the second comparison example.

On the other hand, deterioration curve 292 is a deterioration curve of a light output of the nitride semiconductor laser element according to the second comparison example. The nitride semiconductor laser element according to the second comparison example differs from the nitride semiconductor laser element according to the second embodiment in FIG. 6 in the structure of the end face protection film in which silicon oxide film ($SiO_2$ film) 234 on third protection film (AlN film) 265 is eliminated from the multi-layer protection film on the front end face. FIG. 11B shows the detailed structure of the multi-layer protection film on the front end face of the nitride semiconductor laser element according to the second comparison example. Referring to FIG. 11B, AlN film 301 corresponding to first protection film 263, $Al_2O_3$ film 302 corresponding to second protection film 264, AlN film 303 corresponding to third protection film 265, $Al_2O_3$ film 304 corresponding to metal oxide film 235, and $SiO_2$ film 305 corresponding to silicon oxide film 236 are formed on/above front end face 271, being arranged sequentially in this order from semiconductor multi-layer structure 50.

The compared aging texts are performed at a case temperature of 60° C. and with an operation current of 1.3 A. As a result, the light outputs of both the nitride semiconductor laser elements according to the present embodiment and the second comparison example are approximately 2.0 W at initial current application.

Referring back to FIG. 10, deterioration curve 291 shows that the nitride semiconductor laser element according to the present embodiment operates with hardly deterioration until 1000 hours have passed. In contrast, in FIG. 10, deterioration curve 292 shows that the nitride semiconductor laser element according to the second comparison example (having a structure in which AlN film 303 is in contact with $Al_2O_3$ film 304 without a $SiO_2$ film between AlN film 303 and $Al_2O_3$ film 304 in the multi-layer protection film on the front end face) has a sudden death when approximately 820 hours have passed.

FIG. 11A shows a cross-sectional TEM image of a vicinity of the front end face of the nitride semiconductor laser element according to the present embodiment with deterioration curve 291, after an aging test for 1000 hours. For comparison, FIG. 11B shows a cross-sectional TEM image of a vicinity of the front end face of the nitride semiconductor laser element according to the second comparison example with deterioration curve 292, after an aging test for 820 hours.

As seen in FIG. 11A, in the nitride semiconductor laser element according to the present embodiment of the present invention which has the multi-layer protection film structure on the front end face, converted region 317 is seen in a light transmission region of $Al_2O_3$ film 315. However, peeling does not occur in the end face protection film even after the 1000-hour aging test.

On the other hand, as seen in FIG. 11B, in the nitride semiconductor laser element according to the second comparison example, peeling 306 occurs between AlN film 303 and $Al_2O_3$ film 304 in the oxygen diffusion suppression layer. It is supposed that a sudden death happens when the aging test has been performed for 820 hours. Furthermore, in AlN film 303, solid-phase reaction progresses to cause oxidation.

The above results show that the nitride semiconductor laser element according to the present embodiment is capable of suppressing peeling of the end face protection film, and significantly suppressing deterioration caused by solid-phase reaction in the AlN film in contact with the oxygen diffusion suppression layer.

Figure 12A:
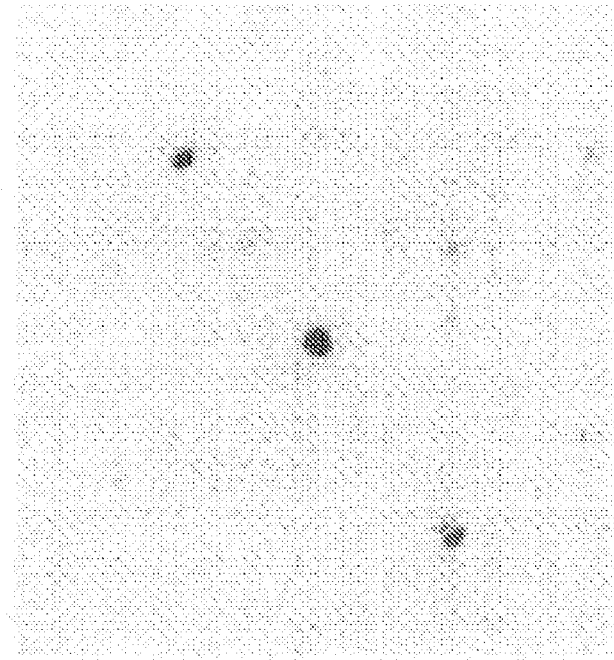
FIG. 12A shows a transmission electron beam diffraction pattern in a region in which an $Al_2O_3$ film is converted in the multi-layer protection film on the front end face of the nitride semiconductor laser element according to the present invention.
Figure 12B:
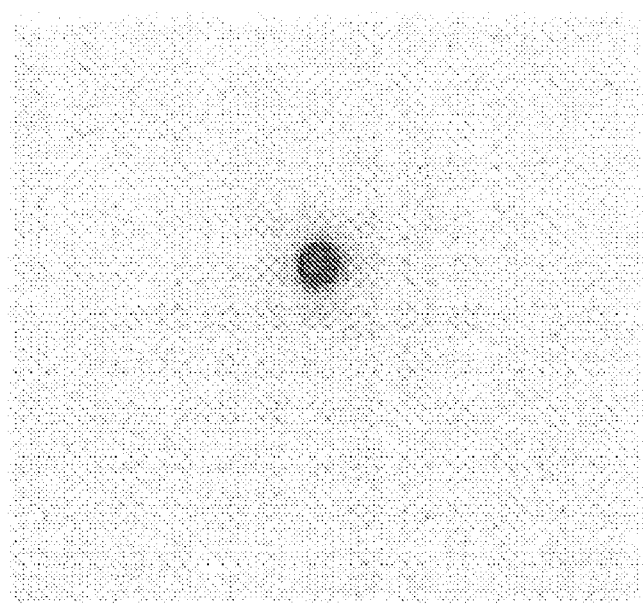
FIG. 12B shows a transmission electron beam diffraction pattern in a region in which the $Al_2O_3$ film is not converted in the multi-layer protection film on the front end face of the nitride semiconductor laser element according to the present invention.

Furthermore, converted region 317 is a crystalline $Al_2O_3$ layer. FIG. 12A shows a transmission electron beam diffraction pattern of converted region 317 in $Al_2O_3$ film 315 in FIG. 11A. FIG. 12B shows a transmission electron beam diffraction pattern of non-converted region 318 except converted region 317 in $Al_2O_3$ film 315 in FIG. 11A. Referring to FIG. 12A, in converted region 317, a clear electron beam diffraction pattern is seen. Therefore, it is supposed that a crystalline film is formed. However, as seen in FIG. 12B, in region 318 where $Al_2O_3$ film is not converted, the electron beam diffraction pattern is a halo pattern without diffraction peak characterized in amorphous. Furthermore, converted region 317 almost matches a near-field image region of laser light emitted from the semiconductor laser element.

Therefore, $Al_2O_3$ film 315 is formed as an amorphous $Al_2O_3$ film in manufacturing, but long-hour light irradiation would transform the $Al_2O_3$ film to have higher crystalline. Furthermore, the results show that the provision of the oxygen diffusion suppression layer in which the $Al_2O_3$ film is provided between the $SiO_2$ films can considerably suppress deterioration of the end face protection film, such as film peeling and solid-phase reaction of the AlN film.

Although the mechanism is not completely clear, the above-described suppression is supposed to result from the provision of the oxygen diffusion suppression layer according to the present invention. The oxygen diffusion suppression layer would suppress solid-phase reaction causing oxidation with nitrogen, at the same time, suppress oxygen diffusion. It is supposed that the solid-phase reaction is suppressed because a speed of the oxidation reaction is slow if the protection film on the AlN film is a $SiO_2$ film, while the AlN oxidation reaction progresses speedily if the protection film is an $Al_2O_3$ film. The oxygen barrier effects would be enhanced by crystallization of the $Al_2O_3$ film.

Furthermore, the effects and the supposed mechanism of the nitride semiconductor laser element according to the present embodiment are described with reference to TEM photographs of a vicinity of front end faces after performing an aging test on nitride semiconductor laser elements according to the following third and fourth comparison examples.

Figure 13A:
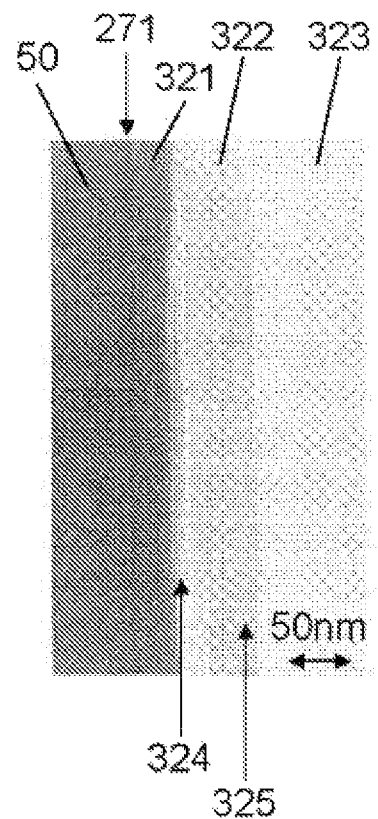
FIG. 13A is a cross-sectional transmission electron beam image regarding a nitride semiconductor laser element after being aged, according to a third comparison example.
Figure 13B:
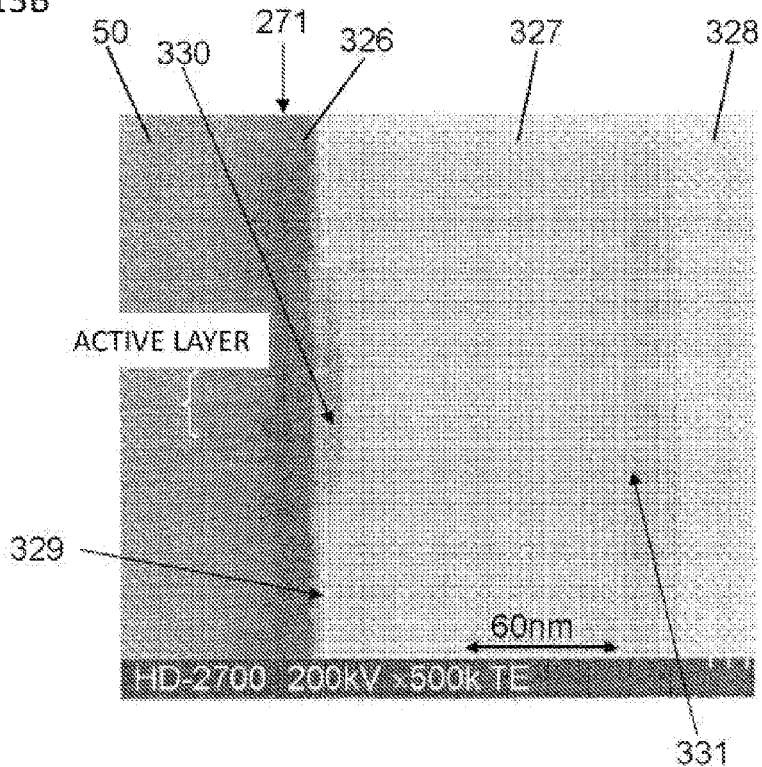
FIG. 13B is a cross-sectional transmission electron beam image regarding a nitride semiconductor laser element after being aged, according to a fourth comparison example.

FIG. 13A is a cross-sectional TEM image of a front end face region after performing an aging test on the nitride semiconductor laser element according to the third comparison example. FIG. 13B is a cross-sectional TEM image of a front end face region after performing an aging test on the nitride semiconductor laser element according to the fourth comparison example. Both the nitride semiconductor laser elements according to the third and fourth comparison examples have a multi-layer protection film on the front end face. The multi-layer protection film includes three films which are an AlN film, an $Al_2O_3$ film, and a $SiO_2$ film. However, a thickness of each of the films is different between the third and fourth comparison examples. On each of such nitride semiconductor laser elements, an aging test is performed at an operation light output of 2 W and a case temperature of 60° C. Then, the results are compared. FIG. 13A shows a sample of a vicinity of the front end face after performing the aging test for 300 hours. FIG. 13B shows a sample of a vicinity of the front end face after performing the aging test for 900 hours. Referring to FIG. 13A, in the multi-layer protection film on the front end face of the nitride semiconductor laser element according to the third comparison example, AlN film 321 has a thickness of 30 nm, $Al_2O_3$ film 322 has a thickness of 45 nm, and outermost $SiO_2$ film 323 has a thickness of 60 nm. In contrast, referring to FIG. 13B, in the multi-layer protection film on the front end face of the nitride semiconductor laser element according to the fourth comparison example, AlN film 326 has a thickness of 10 nm, $Al_2O_3$ film 327 has a thickness of 110 nm, and outermost $SiO_2$ film 328 has a thickness of 15 nm. $Al_2O_3$ film 327 according to the fourth comparison example is thicker than $Al_2O_3$ film 322 according to the third comparison example. As seen in FIG. 13A, in the third comparison example, reactive layer 324 is formed on an interface between AlN film 321 and $Al_2O_3$ film 322 although the aging test is performed for 300 hours only. In analyzing compositions, AlON is found in this region. It is therefore supposed that the AlN film is oxidized in this region. The AlN film would be oxidized when external oxygen in $Al_2O_3$ film 322 and $SiO_2$ film 323 are diffused. Furthermore, since the structure of the end face protection film according to the third comparison example is the same as that according to the first comparison example, the AlN film oxidation is supposed to be a previous state of deterioration with peeling as seen in FIG. 8. In contrast, referring to FIG. 13B, in the nitride semiconductor laser element according to the fourth comparison example, there is hardly seen a reactive layer or peeling on an interface between AlN film 326 and $Al_2O_3$ film 327, although the aging test is performed three times as long as that in the third comparison example in FIG. 13A. The results would show that the increase of the thickness of $Al_2O_3$ film 327 increases a distance of oxygen diffusion and eventually suppresses oxidation of the AlN film. While the thickness of $Al_2O_3$ film 322 in the third comparison example in FIG. 13A is 45 nm, the thickness of $Al_2O_3$ film 327 in the fourth comparison example in FIG. 13B is 110 nm. The difference of thickness is about 2.4 times.

However, a difference of the deterioration degree of the protection film which depends on a time period of an aging test is three times or more. Therefore, merely the increase of an oxygen diffusion distance is not enough to explain why solid-phase reaction is further suppressed in the fourth comparison example in comparison with the third comparison example.

Meanwhile, FIGS. 13A and 13B show that crystallization progresses in regions 325, 330, and 331 in the $Al_2O_3$ films. In particular, as seen in FIG. 13B, in the fourth comparison example, crystallization of region 330 close to the AlN film in the $Al_2O_3$ film progresses more than that in the third comparison example in FIG. 13A. From the results, the increase of the thickness of the $Al_2O_3$ film is supposed to decrease a speed of external oxygen diffusion to arrive at the interface between the AlN film and the $Al_2O_3$ film. Therefore, optical crystallization of the $Al_2O_3$ film would occur previously. In other words, when the laser is operating, optical crystallization of the $Al_2O_3$ film and the photooxidation reaction in the AlN film are supposed to occur at the same time. Since the AlN film oxidation requires oxygen, optical crystallization would occur first in the state where oxygen is not arrived. The existence of the crystalline layer (region 330) significantly suppresses the oxygen diffusion. The solid-phase reaction in the AlN film would therefore be suppressed in the fourth comparison example, although the time period of the aging test in the fourth comparison example is three times as long as that in the third comparison example. It is known that $Al_2O_3$ films formed by sputtering generally have a low film density, and that crystallization requiring oxygen supply increases the film density. Therefore, oxygen barrier effects would be increased by the increase of the film density caused by the crystallization of the $Al_2O_3$ film. However, as shown in the fourth comparison example of FIG. 13B, a reactive layer is slightly seen. In Watt-class high light output operation, mere suppression of oxygen diffusion caused by $Al_2O_3$ film crystallization is not enough. The suppression is to be combined with solid-phase reaction suppression effects of the AlN film which is caused by $SiO_2$. As a result, a robust end face protection film can be formed. Therefore, the oxygen diffusion suppression layer according to the present embodiment is formed on the AlN film to produce both (a) the effects of suppressing oxidation reaction in the AlN film which is caused by $SiO_2$ and (b) the oxygen barrier effects caused by crystallizing the $Al_2O_3$ film. It is thereby possible to provide a robust end face protection film that prevents deterioration of the end face protection film even in Watt-class high light output operation. As a result, the semiconductor device having a high reliability can be provided.

Next, a material of the metal oxide layer for suppressing oxygen diffusion is described. The effects of suppressing oxygen diffusion are produced by the metal oxide layer provided between the $SiO_2$ films. In particular, the metal oxide layer is required to be made of a material that increases a film density when laser operation occurs optical crystallization. Furthermore, the end face protection film is required to be transparent for a laser oscillation wavelength. Although it has been described in the embodiments of the present invention that the metal oxide film is an $Al_2O_3$ film from the above aspects, the metal oxide film is not limited to the above as long as one of zirconium, hafnium, titanium, tantalum, and zinc is included. The films comprising these metal elements are easily formed by using the metal elements as solid targets in ECR sputtering or magnetron reactive sputtering. In addition, the films comprising these metal elements are easily crystallized. In particular, zirconium oxide and titanium oxide are speedily optical-crystallized. Therefore, zirconium oxide and titanium oxide are suitable as materials for the metal oxide layer included in the oxygen diffusion suppression layer. For the same reason, the metal oxide layer in the end face protection layer in the nitride semiconductor laser element according to the second embodiment is not necessarily limited to the $Al_2O_3$ film. The metal oxide layer may be an other oxide film including one of zirconium, hafnium, titanium, tantalum, and zinc.

It should be noted that, regarding the metal oxide layer between the $SiO_2$ layers, a refractive index of the $SiO_2$ layers with respect to light having a wavelength of around 400 nm is 1.4 that is close to a refractive index of air (approximately 1.0). Therefore, in order to gain a high reflectance, the metal oxide layer desirably has a refractive index greater than the refractive index of the $SiO_2$ layers with respect to light having a wavelength of around 400 nm. As a result, the number of the films in the oxygen diffusion suppression layer is decreased to improve an yield of the nitride semiconductor laser element. The following table shows refractive indexes generally used for the metal oxide layer.

TABLE 1

| Material name | Composition | Refractive index |
| --- | --- | --- |
| zirconium oxide | $ZrO_2$ | 2.2 |
| aluminum oxide | $Al_2O_3$ | 1.65 |
| titanium oxide | $TiO_2$ | 2.1 |
| zinc oxide | $ZnO_2$ | 2.0 |
| titanium oxide | $Ta_2O_5$ | 2.2 |

Next, the description is given for a difference between the nitride semiconductor laser element according to the first embodiment of the present invention and the nitride semiconductor laser element according to the second embodiment of the present invention.

In the nitride semiconductor laser element according to the first embodiment, the multi-layer protection film on the front end face has the four-layer structure. The multi-layer protection film according to the first embodiment includes an AlN film, an $SiO_2$ film, an $Al_2O_3$ film, and an $SiO_2$ film, which are arranged sequentially in this order from the light-emitting end face. In contrast, in the nitride semiconductor laser element according to the second embodiment, the multi-layer protection film on the front end face has the six-layer structure. The multi-layer protection film according to the second embodiment includes an AlN film, an $Al_2O_3$ film, an AlN film, an $SiO_2$ film, an $Al_2O_3$ film, and an $SiO_2$ film, which are arranged sequentially in this order from the light-emitting end face. The structure according to the first embodiment differs from the structure according to the second embodiment in that the single-layer structure of the AlN film in the end face protection layer is changed to a three-layer structure including an AlN film, a metal oxide film, and an AlN film. The use of two AlN films can prevent oxygen from reaching the GaN end face. As a result, it is expected to more surely prevent oxygen diffusion. Furthermore, as seen in FIG. 11A, AlN film 311 and AlN film 313 have different crystalline. This is because AlN film 311 is formed on the crystalline GaN end face (m plane) to be a film having high single crystalline mainly m-axis orientated, while AlN film 313 is formed on the amorphous metal oxide film to be a polycrystalline film mainly c-axis orientated. Furthermore, AlN film 311 has large residual strain and stress, because AlN film 311 has a large crystal grain size and lattice unconformity on the m plane of GaN. In contrast, AlN film 313 has a small film stress, because AlN film 313 is a polycrystalline film. Therefore, if the end face protection layer has the three-layer structure, it is possible to suppress peeling caused by the crystallization of the $Al_2O_3$ film. Furthermore, since AlN film 311 is a single-crystalline film, the substrate effects of AlN film 311 causes the metal oxide film to have refine crystals when the metal oxide film is crystallized due to photooxidation. As AlN film 313 suppresses oxygen diffusion, the crystallization of the $Al_2O_3$ film in the multi-layer protection film on the front end face is further facilitated. As a result, both the end face protection layer and the oxygen diffusion suppression layer increase oxygen barrier effects. It is therefore possible to provide the highly reliable semiconductor laser even in high output operation. Here, the metal oxide film in the end face protection layer is desirably thin in order to prevent peeling. In the nitride semiconductor laser element according to the second embodiment, the thickness of the metal oxide film ($Al_2O_3$ film) in the end face protection layer is set to 10 nm.

It should be noted that, regarding the nitride semiconductor laser elements according to the above embodiments of the present invention, the composition of the nitride semiconductor and the used substrate are not limited to the above. It is possible to select any appropriate composition for the nitride semiconductor and any appropriate substrate to obtain a desirable oscillation wavelength.

More specifically, for example, a central wavelength of emitting light may be shorter than 390 nm or longer than 430 nm.

Although it has been described in the above embodiments that the thickness (remaining thickness) of the side part of each ridged waveguide 50a in p-type cladding layer 18 is approximately 0.1 μm, that the width of the lower part of each ridged waveguide 50a is approximately 10 μm, and that the width of the upper part of each ridged waveguide 50a is approximately 8 μm, these are merely examples and the present invention is not limited to the above. For example, if the present invention is used as a light source for a Blu-ray (registered mark) disc, the width of each ridged waveguide may be in a range from 1 μm to 2 μm to allow the present invention to serve as a single mode laser. In the case of a light source for processing, a light source for a projector or a laser television, or a light source for exciting a lighting device, the width of each ridged waveguide may be in a range from 2 μm to 100 μm depending on a used light output.

It should also be noted that, in the above-described embodiments, a film included in end face protection layer 31 or 261 may be an AlN film doped with impurity. For example, the film may be an Al(O)N film doped with a small amount of oxygen.

It should also be noted that, in the above-described embodiments, a film included in end face protection layer 31 or 261 may be an aluminum oxynitride (AlON) film.

This aluminum oxynitride film is desirably a crystalline film. For example, it is desirable that the aluminum oxynitride film mainly has m-axis orientation with respect to the light-emitting end face.

If aluminum oxynitride films are included in end face protection layer 31 or 261, it is desirable that a crystalline film mainly having m-axis orientation is used as an aluminum oxynitride film on the nitride semiconductor layer in the semiconductor laser element, and that a film mainly having c-axis orientation is used as an aluminum oxynitride film connected to the mainly m-axis oriented crystalline film via the metal oxide film.

Next, the description is given for the aluminum oxynitride films (AlON films) used as films included in end face protection layer 31 or 261.

If a film is formed from AlON by ECR sputtering, mixed gas of $O_2$ and $N_2$ is used as reactive gas. It should be noted that, in order to control a speed of forming the film, argon (Ar) gas is introduced in the ECR chamber at the same time. In the present embodiments, in forming the AlON film, in order to control a composition ratio of N in the AlON, an Ar flow rate is set to 20 ml/min, an $N_2$ flow rate is set to 5.5 ml/min, and an $O_2$ flow rate is varied. Here, a flow rate of each gas is set to a normal state (where 0° C., 1 air pressure) (hereinafter, the same conditions are applied). In the present embodiments, an AlON film is manufactured, varying the $O_2$ flow rate from 0 ml/min to 1.0 ml/min. However, the flow rates of the above gas are mere examples and not limited to the above.

Figure 14:
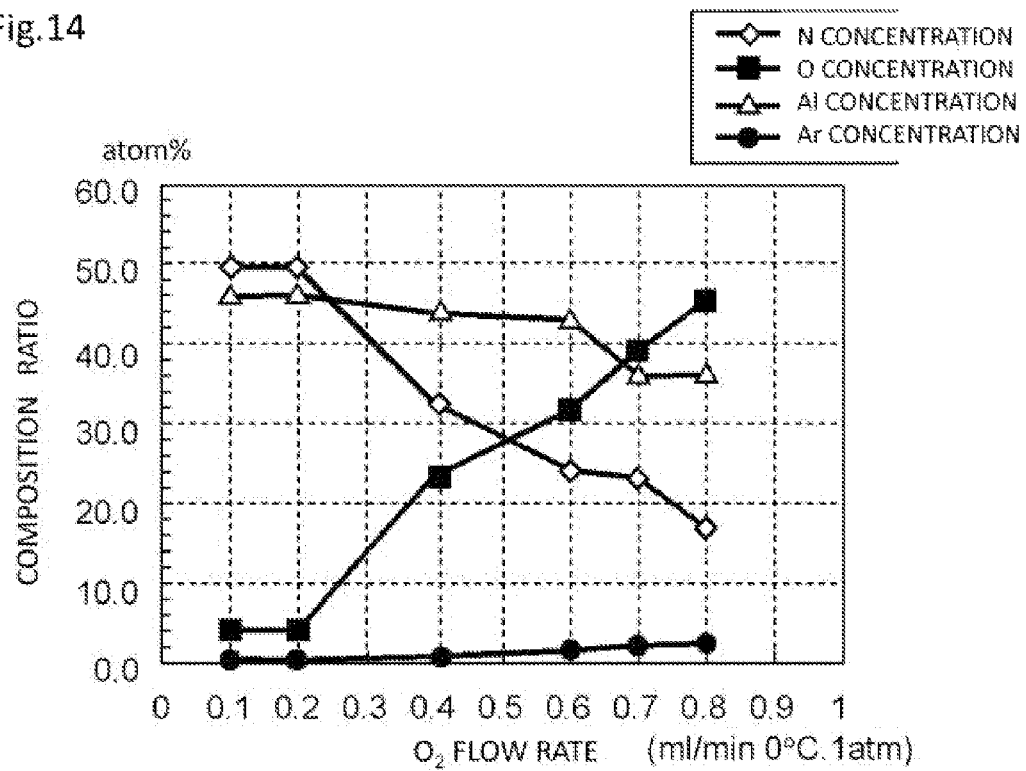
FIG. 14 is a graph potting a relationship between an oxygen flow rate and composition of each atom in an AlON (aluminum oxynitride) film according to the present embodiment.

FIG. 14 plots a relationship between an $O_2$ flow rate and a composition of each element in AlON in forming an AlON film. Here, a composition of N atoms (N atomic composition) is determined by the following equation.

N atomic composition (%)=(the number of N atoms/
  sum of the number of Al atoms, N atoms, and O
  atoms)×100

Here, an Ar flow rate is 20 ml/min, and an $N_2$ flow rate is 5.5 ml/min. FIG. 14 shows that, as the $O_2$ flow rate increases, the N composition decreases and the O composition increases. Furthermore, as an atmosphere gas in the sputtering is Ar, a slight amount of Ar is detected from the film. As the composition is changed, a physicality of AlON is also changed.

Figure 15:
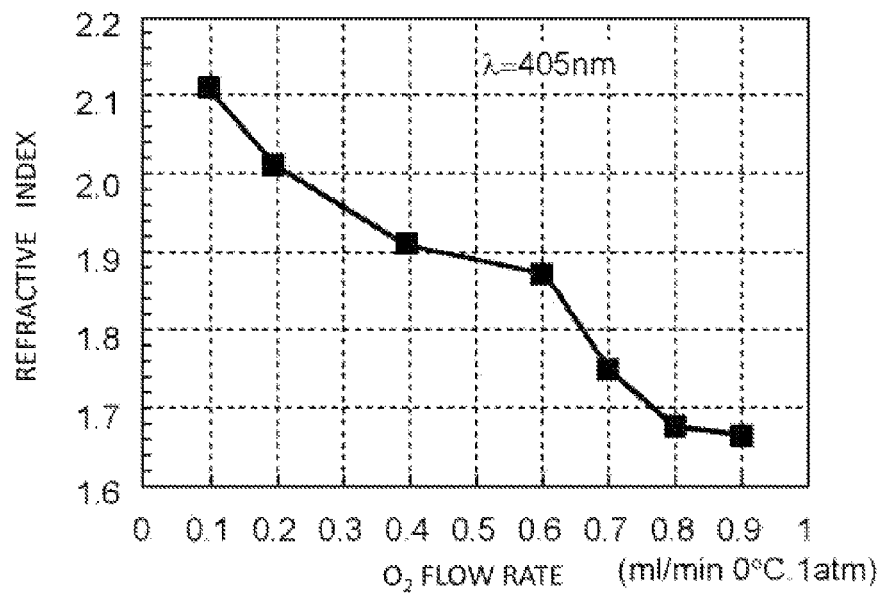
FIG. 15 is a graph potting a relationship between an oxygen flow rate and a refractive index regarding the AlON film according to the present embodiment.

FIG. 15 plots a relationship between an $O_2$ flow rate and a refractive index with respect to light having a wavelength λ of 405 nm. A refractive index of an AlN film not including oxygen is approximately 2.1, while a refractive index of an $Al_2O_3$ film not including nitrogen is 1.65. FIG. 15 shows that as the $O_2$ flow rate increases, the refractive index of the AlON film gradually decreases from a refractive index close to that of an AlN film to a refractive index close to that of an $Al_2O_3$ film.

Figure 16:
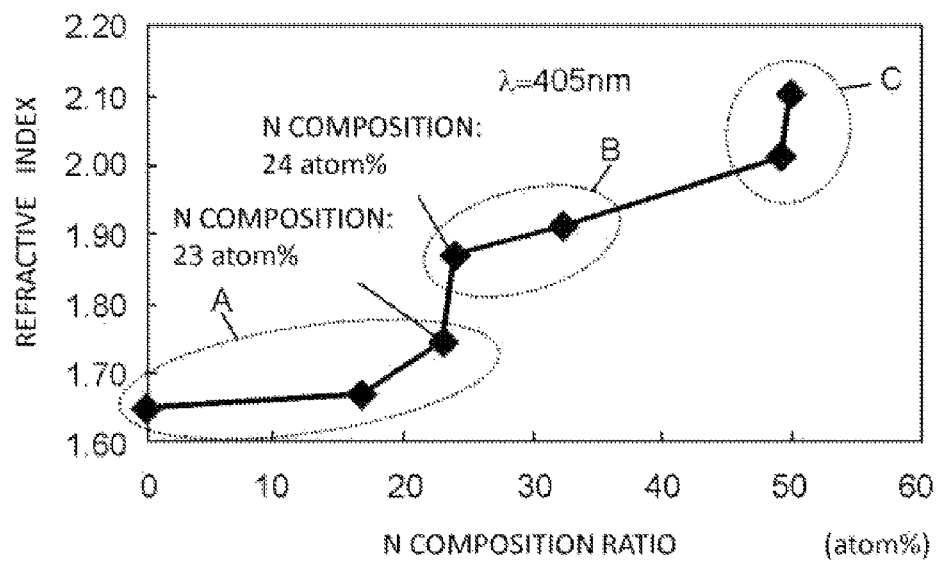
FIG. 16 is a graph potting a relationship between composition of N (nitrogen) atoms and a refractive index regarding the AlON film according to the present embodiment.

FIG. 16 plots a relationship between N atomic composition and a refractive index (with respect to light having a wavelength λ of 405 nm) in the AlON film manufactured according to the present embodiment. In FIG. 16, a horizontal axis represents the composition of nitrogen atoms included in the AlON film by atom %, and a vertical axis represents the refractive index. N atomic composition of O atom % means $Al_2O_3$. N atomic composition of 50 atom % means AlN. The inventors of the present invention have found that, as seen in FIG. 16, the formed film is classified into three groups having different refractive indexes according to the N atomic composition. Here, a group having N atomic composition in a range from 0 atom % to 23 atom % is referred to as group A. A group having N atomic composition in a range from 24 atom % to 40 atom % is referred to as group B. A group having N atomic composition of 40 atom % or more is referred to as group C. Here, if N atomic composition is 40 atom % or more, in other words, if the formed film belongs to group C, it is seen that the film has a refractive index of around 2.0 that is almost equal to a refractive index of AlN.

Figure 17:
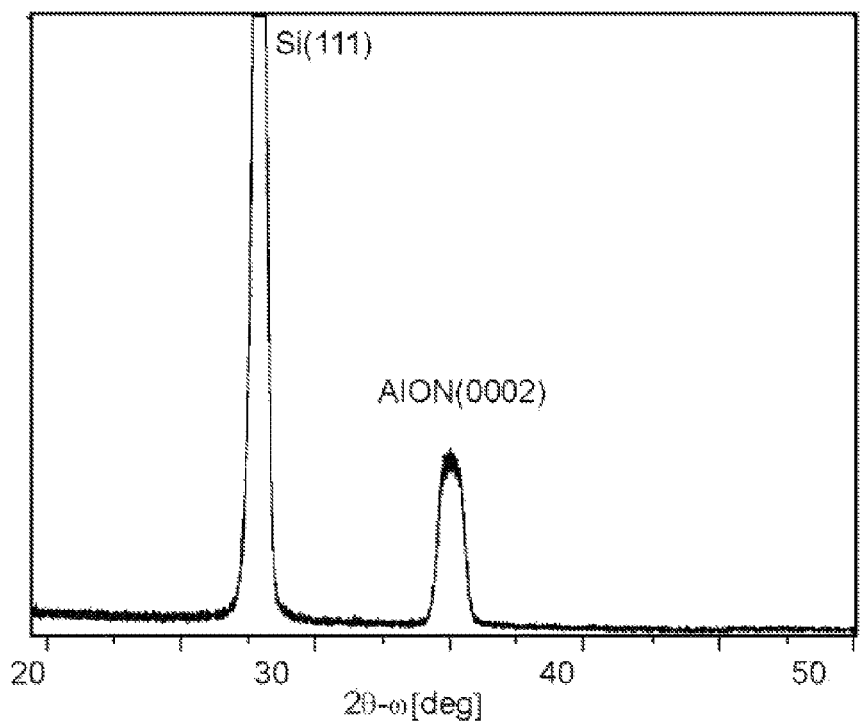
FIG. 17 is a graph of an X-ray diffraction spectrum of AlON films in group C according to the present embodiment.
Figure 18:
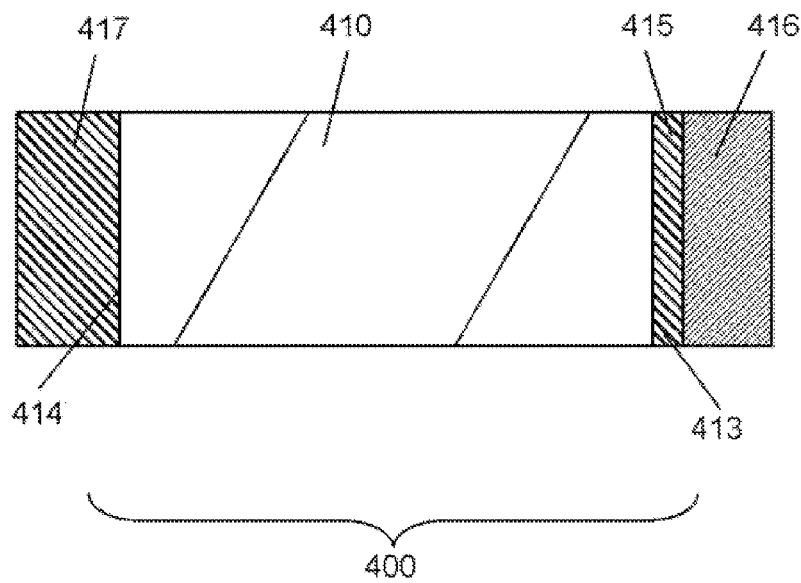
FIG. 18 is a schematic cross-sectional view of the conventional nitride semiconductor laser element.

Next, FIG. 17 shows an X-ray diffraction spectrum of an AlON film belonging to group C having N atomic composition of 40% or more. While an AlON film belonging to group A or B is an amorphous film, an AlON film belonging to group C is a crystalline film having the same X-ray diffraction spectrum as that of an AlN film. Therefore, an AlON film in group C is a crystalline film having the same crystalline structure as that of an AlN film. From the above results, it is assumed that an AlON film belonging to group C has the same physicality as that of an AlN film. Therefore, a film included in end face protection layer 31 or 261 may be an AlON film having N atomic composition of 40% or more.

It should be noted that it has been described that the oxide film provided between the AlN film and the $Al_2O_3$ film is a silicon oxide film, the oxide film may be other oxide film as long as the oxide film is not converted by laser light. Likewise, the silicon oxide film on the surface of the $Al_2O_3$ film may be other oxide film.

INDUSTRIAL APPLICABILITY

The nitride semiconductor laser element according to the present invention is capable of preventing peeling of an end face protection film protecting an active layer even in laser oscillation and also preventing the protection film from optical breakdown. In particular, the nitride semiconductor laser element according to the present invention is useful as semiconductor laser elements having a protection film for protecting an end face including a surface of an exposed active layer.

REFERENCE MARKS IN THE DRAWINGS 1, 201 nitride semiconductor laser element
11 n-type substrate
12 n-type semiconductor layer
13 n-type cladding layer
14 n-type light guide layer
15 multiple quantum well active layer
16 p-type light guide layer
17 p-type electron block layer
18 p-type cladding layer
19 p-type contact layer
20 mask layer
21 P-side electrode
22 N-side electrode
25 multi-layer protection layer on rear end face
28 front end face (light-emitting end face)
29 rear end face
30, 230 multi-layer protection film on front end face
31, 261 end face protection layer
32, 232 oxygen diffusion suppression layer
33 protection film (AlN film)
34, 234 silicon oxide film ($SiO_2$ film)
35, 235 metal oxide film ($Al_2O_3$ film)
36, 236 silicon oxide film ($SiO_2$ film)
40 laser bar sample
41 target material
42 plasma producing chamber
50 semiconductor multi-layer structure
51 semiconductor laser device
50a ridged waveguide
52 stem
52a electrode terminal
52b laser holding unit
53 cap
53a window part
54 glass plate
55 sealing gas
263 first protection film (AlN film)
264 second protection film ($Al_2O_3$ film)
265 third protection film (AlN film)
271 front end face
272 first end face protection film (AlN film)
273 second end face protection film ($Al_2O_3$ film)
274 third end face protection film ($SiO_2$ film)
275 peeling
291 deterioration curve
292 deterioration curve
301 AlN film
302 metal oxide film ($Al_2O_3$ film)
303 AlN film
304 $Al_2O_3$ film
305 $SiO_2$ film
306 peeling
311 AlN film
312 metal oxide film ($Al_2O_3$ film)
313 AlN film
314 silicon oxide film ($SiO_2$ film)
315 metal oxide film ($Al_2O_3$ film)
316 silicon oxide film ($SiO_2$ film)
317 converted region
318 non-converted region
321 AlN film
322 $Al_2O_3$ film
323 $SiO_2$ film
324 reactive layer of AlN film
325 region
326 AlN film
327 $Al_2O_3$ film
328 $SiO_2$ film
330 region
331 region
400 nitride semiconductor laser element
410 nitride semiconductor layer
413 front end face
414 rear end face
415 first end face coat film
416 second end face coat film
417 end face coat film

The invention claimed is:

1. A nitride semiconductor laser element comprising:
a semiconductor laminate made of a group III nitride semiconductor and including a light-emitting end surface; and
a protection film formed of a dielectric multilayer film formed to cover the light-emitting end surface of the semiconductor laminate,
wherein the protection film includes an end surface protection layer and an oxygen diffusion suppressing layer, and the end surface protection layer and the oxygen diffusion suppressing layer are disposed in order of the end surface protection layer and the oxygen diffusion suppressing layer from a side of the light-emitting end surface;
the end surface protection layer is a layer including a crystalline aluminum nitride film;
the oxygen diffusion suppressing layer includes at least a single layer of a metal oxide film and at least a single layer of a silicon oxide film, and the silicon oxide film and the metal oxide film are disposed in this order from a side of the end surface protection layer; and
the metal oxide film is crystallized by laser light emitted from the light-emitting end surface, and
the metal oxide film is aluminum oxide film.

2. A nitride semiconductor laser element comprising:
a semiconductor laminate made of a group III nitride semiconductor and including a light-emitting end surface; and
a protection film formed of a dielectric multilayer film formed to cover the light-emitting end surface of the semiconductor laminate,
wherein the protection film includes an end surface protection layer and an oxygen diffusion suppressing layer, and the end surface protection layer and the oxygen diffusion suppressing layer are disposed in order of the end surface protection layer and the oxygen diffusion suppressing layer from a side of the light-emitting end surface;
the end surface protection layer is a layer including a crystalline aluminum nitride film;
the oxygen diffusion suppressing layer includes at least a single layer of a metal oxide film and at least two layers of silicon oxide film, and the silicon oxide film is sandwiched by the two layers of the silicon oxide film; and
the metal oxide film is crystallized by laser light emitted from the light-emitting end surface, and
the metal oxide film is aluminum oxide film.

3. The nitride semiconductor laser element according to claim 1,
wherein the end surface protection layer includes a first aluminum nitride film that directly covers the light-emitting end surface, a first metal oxide film that is disposed to cover the first aluminum nitride film, and a second aluminum nitride film that is disposed to cover the first metal oxide film.

4. The nitride semiconductor laser element according to claim 3,
wherein the first metal oxide film is an aluminum oxide film.

5. The nitride semiconductor laser element according to claim 3,
wherein the first aluminum nitride film includes a main component of an m-axis orientation with respect to the light-emitting end surface, and
the second aluminum nitride film includes a main component of a c-axis orientation.

6. The nitride semiconductor laser element according to claim 1,
wherein a reflectance of the light-emitting end surface of the nitride semiconductor laser element is either a maximum value or a minimum value of a reflectance spectrum for a wavelength of laser light emitted from the light-emitting end surface.

7. The nitride semiconductor laser element according to claim 1,
wherein a region in the metal oxide film crystallized by the laser light is a region of a near field image of the laser light.

8. A nitride semiconductor laser element comprising:
a semiconductor laminate made of a group III nitride semiconductor and including a light-emitting end surface; and
a protection film formed of a dielectric multilayer film formed to cover the light-emitting end surface of the semiconductor laminate,
wherein the protection film includes an end surface protection layer and an oxygen diffusion suppressing layer, and the end surface protection layer and the oxygen diffusion suppressing layer are disposed in order of the end surface protection layer and the oxygen diffusion suppressing layer from a side of the light-emitting end surface;
the end surface protection layer is a layer including a crystalline aluminum nitride film;
the oxygen diffusion suppressing layer includes at least a single layer of a metal oxide film and at least a single layer of a silicon oxide film, and the silicon oxide film and the metal oxide film are disposed in this order from a side of the end surface protection layer; and
the metal oxide film is crystallized by laser light emitted from the light-emitting end surface, and
the metal oxide film is aluminum oxide film.

9. A nitride semiconductor laser element comprising:
a semiconductor laminate made of a group III nitride semiconductor and including a light-emitting end surface; and
a protection film formed of a dielectric multilayer film formed to cover the light-emitting end surface of the semiconductor laminate,
wherein the protection film includes an end surface protection layer and an oxygen diffusion suppressing layer, and the end surface protection layer and the oxygen diffusion suppressing layer are disposed in order of the end surface protection layer and the oxygen diffusion suppressing layer from a side of the light-emitting end surface;
the end surface protection layer is a layer including a crystalline aluminum nitride film;
the oxygen diffusion suppressing layer includes at least a single layer of a metal oxide film and at least two layers of silicon oxide film, and the silicon oxide film is sandwiched by the two layers of the silicon oxide film; and
the metal oxide film is crystallized by laser light emitted from the light-emitting end surface, and
the metal oxide film is aluminum oxide film.

10. The nitride semiconductor laser element according to claim 8,
wherein the end surface protection layer includes a first aluminum nitride film that directly covers the light-emitting end surface, a first metal oxide film that is disposed to cover the first aluminum nitride film, and a second aluminum nitride film that is disposed to cover the first metal oxide film.

11. The nitride semiconductor laser element according to claim 10,
wherein the first aluminum nitride film includes a main component of an m-axis orientation with respect to the light-emitting end surface, and
the second aluminum nitride film includes a main component of a c-axis orientation.

12. The nitride semiconductor laser element according to claim 10,
wherein atomic composition of nitrogen in the first aluminum nitride film and the second aluminum nitride film is 40% or more.

13. The nitride semiconductor laser element according to claim 1, wherein the light-emitting end surface is front end surface.

14. The nitride semiconductor laser element according to claim 8, wherein the light-emitting end surface is front end surface.

* * * * *